US012777721B2

(12) United States Patent
Hu et al.

(10) Patent No.: US 12,777,721 B2
(45) Date of Patent: Oct. 27, 2026

(54) DISPLAY DEVICE WITH FIRST ROUTING SECTION WIDTH DIFFERENT FROM SECOND ROUTING SECTION IN OVERLAPPING AREA

(71) Applicant: Tianma Advanced Display Technology Institute (Xiamen) Co., Ltd., Xiamen (CN)

(72) Inventors: Rong Hu, Xiamen (CN); Yongfeng Liu, Xiamen (CN); Xiaoyun Chen, Xiamen (CN); Liang Xing, Xiamen (CN); Aowen Li, Xiamen (CN)

(73) Assignee: Tianma Advanced Display Technology Institute (Xiamen) Co., Ltd., Xiamen (CN)

( * ) Notice: Subject to any disclaimer, the term of this patent is extended or adjusted under 35 U.S.C. 154(b) by 417 days.

(21) Appl. No.: 18/381,299

(22) Filed: Oct. 18, 2023

(65) Prior Publication Data

US 2024/0047482 A1 Feb. 8, 2024

(30) Foreign Application Priority Data

Jun. 30, 2023 (CN) ......................... 202310801904.3

(51) Int. Cl.

| | |
|---|---|
| ***H10D 86/60*** | (2025.01) |
| ***H10D 86/40*** | (2025.01) |
| ***H10H 20/857*** | (2025.01) |
| ***H10H 29/14*** | (2025.01) |
| ***H10W 90/00*** | (2026.01) |

(52) U.S. Cl.

CPC ........... *H10D 86/60* (2025.01); *H10D 86/443* (2025.01); *H10H 20/857* (2025.01); *H10W 90/00* (2026.01)

(58) Field of Classification Search

CPC .... H10D 86/60; H10D 86/443; H10D 86/441; H10H 20/857; H10H 29/142; H10W 90/00; H01L 25/0753; H01L 25/167

See application file for complete search history.

(56) References Cited

U.S. PATENT DOCUMENTS

2021/0375702 A1* 12/2021 Xiao .................... H10D 86/441
2022/0052080 A1* 2/2022 Kim ...................... H01L 25/167

FOREIGN PATENT DOCUMENTS

CN 114255665 A 3/2022

* cited by examiner

*Primary Examiner* — Herve-Louis Y Assouman

(74) *Attorney, Agent, or Firm* — KDW FIRM PLLC

(57) ABSTRACT

Provided are a display panel and a display device. The display panel includes an array substrate, a light-emitting element, a plurality of first connection pads, and a signal line. The array substrate includes a substrate and an array layer, and the array layer is disposed on one side of the substrate and includes a pixel circuit. The light-emitting element is disposed on one side of the array layer facing away from the substrate. The plurality of first connection pads are disposed on the substrate and coupled to the pixel circuit. The signal line includes a first wire segment and a second wire segment, the first wire segment is configured to connect a first connection pad and the second wire segment, or the second wire segment is configured to connect a first connection pad and the first wire segment. The display panel further includes an overlapping region.

19 Claims, 13 Drawing Sheets

B

DISPLAY DEVICE WITH FIRST ROUTING SECTION WIDTH DIFFERENT FROM SECOND ROUTING SECTION IN OVERLAPPING AREA

CROSS-REFERENCE TO RELATED APPLICATION(S)

This application claims priority to Chinese Patent Application No. 202310801904.3 filed Jun. 30, 2023, the disclosure of which is incorporated herein by reference in its entirety.

TECHNICAL FIELD

The present disclosure relates to the field of display technology and, in particular, to a display panel and a display device.

BACKGROUND

In order to improve the display effect of the display device, the display device with a narrow bezel or even no bezel has gradually become one of the development directions of display technology. In order to reduce the width of the bezel, the technology of side wiring is adopted for some display panels, so that of the whole wire is divided into three portions. That is, one portion of the whole wire is disposed on the front surface, one portion of the whole wire is disposed on the side surface and one portion of the whole wire is disposed on the back surface of the display panel. The three portions of the whole wire are made separately. A risk of dislocation exists at the joint of the three portions. Once the dislocation occurs at the joint, the electrical conduction stability of the side wire deteriorates.

SUMMARY

Embodiments of the present disclosure provide a display panel and a display device, which can improve the stability of side wire connection, improve yield and reduce cost.

In a first aspect, a display panel is provided. The display panel includes an array substrate, a light-emitting element, a plurality of first connection pads, and a signal line. The array substrate includes a substrate and an array layer, and the array layer is disposed on one side of the substrate and includes a pixel circuit. The light-emitting element is disposed on one side of the array layer facing away from the substrate. The plurality of first connection pads are disposed on the substrate and coupled to the pixel circuit. The signal line includes a first wire segment and a second wire segment, the first wire segment is configured to connect a first connection pad and the second wire segment, or the second wire segment is configured to connect a first connection pad and the first wire segment. The display panel further includes an overlapping region. In the overlapping region, the first wire segment and the second wire segment at least partially overlap in a direction perpendicular to a plane where the signal line is located. In the overlapping region, a width of the first wire segment is different from a width of the second wire segment in a first direction. The first direction is perpendicular to an extension direction of the signal line.

In a second aspect, a display device is further provided and includes the display panel provided in the first aspect in the embodiment of the present disclosure.

BRIEF DESCRIPTION OF DRAWINGS

To illustrate technical solutions in embodiments of the present disclosure more clearly, the drawings used in description of the embodiments will be briefly described below. Apparently, the drawings described below illustrate merely part of the embodiments of the present disclosure, and those of ordinary skill in the art may obtain other drawings based on the drawings described below on the premise that no creative work is done.

REFERENCE LIST

Figure 1:
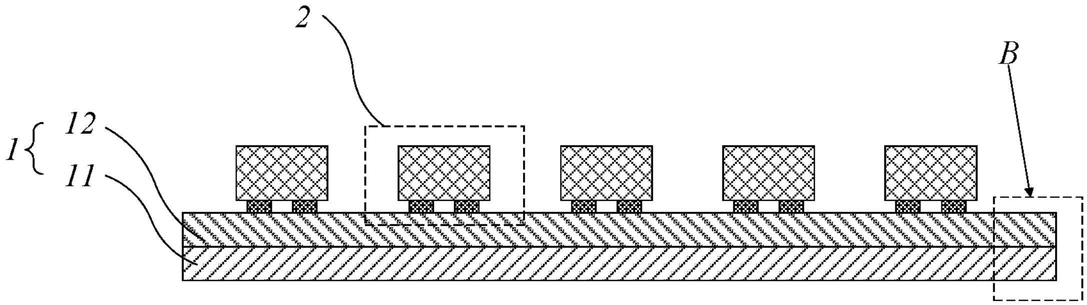
FIG. 1 is a structural view of a display panel according to an embodiment of the present disclosure.

1 array substrate
11 substrate
12 array layer
13 first surface
14 second surface
141 first chamfer portion
142 flat portion
15 third surface
2 light-emitting element
3 first connection pad
4 signal line
41 first wire segment
411 first edge
412 second edge
413 fourth sub-portion
414 fifth sub-portion
42 second wire segment
421 first sub-portion
422 second sub-portion
423 third sub-portion
43 positive power signal line
44 negative power signal line
45 first-type signal line
46 second-type signal line
100 display device
200 display panel
201 first display panel
202 second display panel
300 driver chip
A first direction
D overlapping region

DETAILED DESCRIPTION

Features and example embodiments in various aspects of the present disclosure are described hereinafter in detail. Details are set forth below to facilitate a thorough understanding of the present disclosure. To those skilled in the art, apparently, the present disclosure may be implemented with no need for some of these specific details. The description of the embodiments hereinafter is intended merely to provide a better understanding of the present disclosure through examples of the present disclosure.

It is to be noted that if not in collision, the embodiments and features therein in the present disclosure can be combined with each other. A detailed description will be given below with reference to the drawings and embodiments.

Relationship terms such as first and second are used merely to distinguish one entity or operation from another. It does not necessarily require or imply any such actual relationship or order between these entities or operations. Furthermore, the term "comprising", "including" or any other variant thereof is intended to encompass a non-exclusive inclusion so that a process, method, article, or device that includes a series of elements not only includes the expressly listed elements but may also include other elements that are not expressly listed or are inherent to such process, method, article, or device. In the absence of more restrictions, the elements defined by the statement "including . . . " do not exclude the presence of additional identical elements in the process, method, article, or device that includes the elements.

It is to be understood that when the structure of a component is described and a layer or region is referred to as "on" or "above" another layer or region, it may refer to that the layer or region is directly disposed on another layer or region, or other layers or regions are included between the layer or region and another layer or region. If the component is turned over, the layer or region is located "below" or "underneath" another layer or region.

Additionally, the term "and/or" used herein merely describes the association relationships between associated objects and indicates that three relationships may exist. For example, A and/or B may indicate three cases: A exists alone, A and B both exist, and B exists alone.

Additionally, the character "/" used herein typically indicates that the front and rear associated objects are in an "or" relationship.

It is to be understood that in embodiments of the present disclosure, "B corresponding to A" refers to that B is associated with A, and B may be determined according to A. It is to be further understood that determining B according to A does not refer to determining B according to A alone, but may also be determining B according to A and/or other information.

The applicant has found that wiring is typically configured in the bezel region of the display panel. In order to reduce the bezel of the display panel and increase the proportion of the display region, the side wiring method is adopted, reducing the occupation of the bezel region by the wire, and thus increasing the proportion of the display region. In the manner of side wiring, a part of the wire is disposed on the front surface, a part of the wire is disposed on the side surface and a part of the wire is disposed on the back surface of the display panel. Taking the wire on the front surface and the side surface as an example, the wire segment on the front surface and the wire segment on the side surface need to be made separately by two processes, need to be lapped together, and need high-precision locating along the width direction of the two wire segments so that the two wire segments can be just lapped together. Once the error of locating between the two wire segments is too large, the width of the part where the two wire segments can actually be lapped becomes smaller, increasing the contact resistance, even causing open circuit, and resulting in poor electrical stability of the wire.

In view of the preceding problem, the applicant provides a display panel and a display device. The display panel includes an array substrate, a light-emitting element, a first connection pad and a signal line. The first wire segment is configured to connect the first connection pad and the second wire segment, or the second wire segment is configured to connect the first connection pad and the first wire segment. The first wire segment and the second wire segment overlap in an overlapping region; and in the overlapping region, the width of the first wire segment is different from the width of the second wire segment in a first direction. When the first wire segment and the second wire segment are lapped, the width of the first wire segment is different from the width of the second wire segment in the first direction, and the extra part along the first direction may form a redundant space when the first wire segment and the second wire segment are connected. When the error of locating between the first wire segment and the second wire segment exists in the first direction, the width of the actual overlapping region of the first wire segment and the second wire segment can still meet the connection requirement of the first wire segment and the second wire segment due to the redundant space, so that good stability of physical connection and electrical connection is provided at the joint of the first wire segment and the second wire segment, further improving the yield of the display panel. The maximum error of locating between the first wire segment and the second wire segment in the first direction can also be increased, reducing the requirement of the preparation process on the locating accuracy, and further reducing the preparation cost of the display panel.

Figure 2:
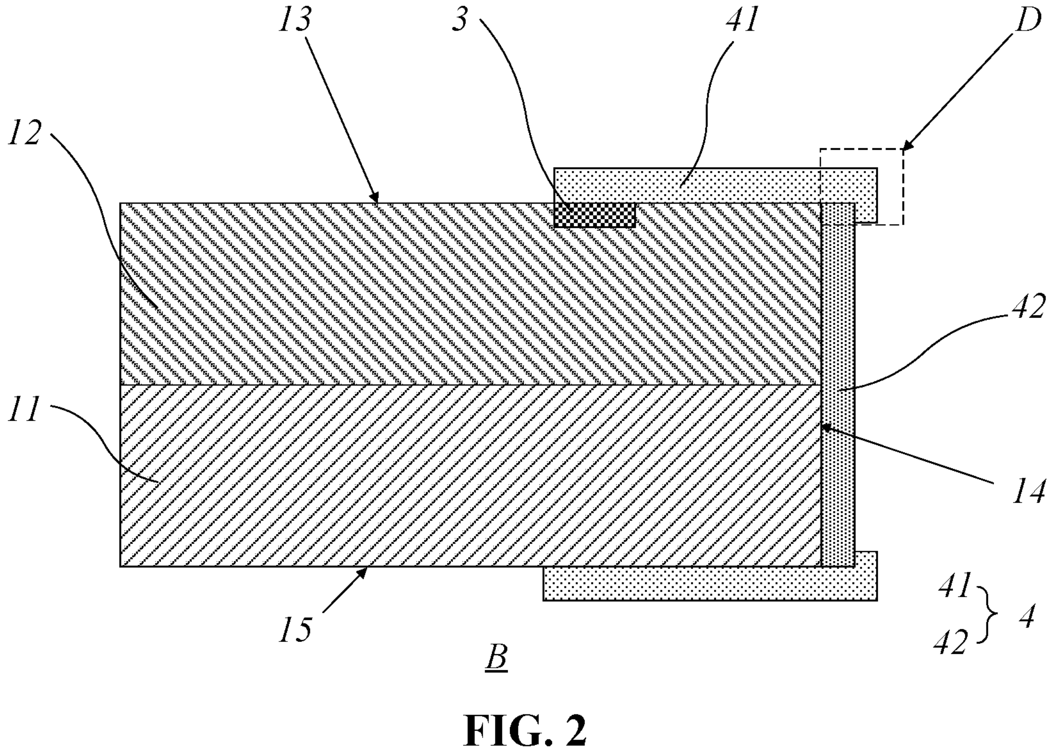
FIG. 2 is a partial enlarged view of a region B of the display panel shown in FIG. 1 according to an embodiment of the present disclosure.
Figure 3:
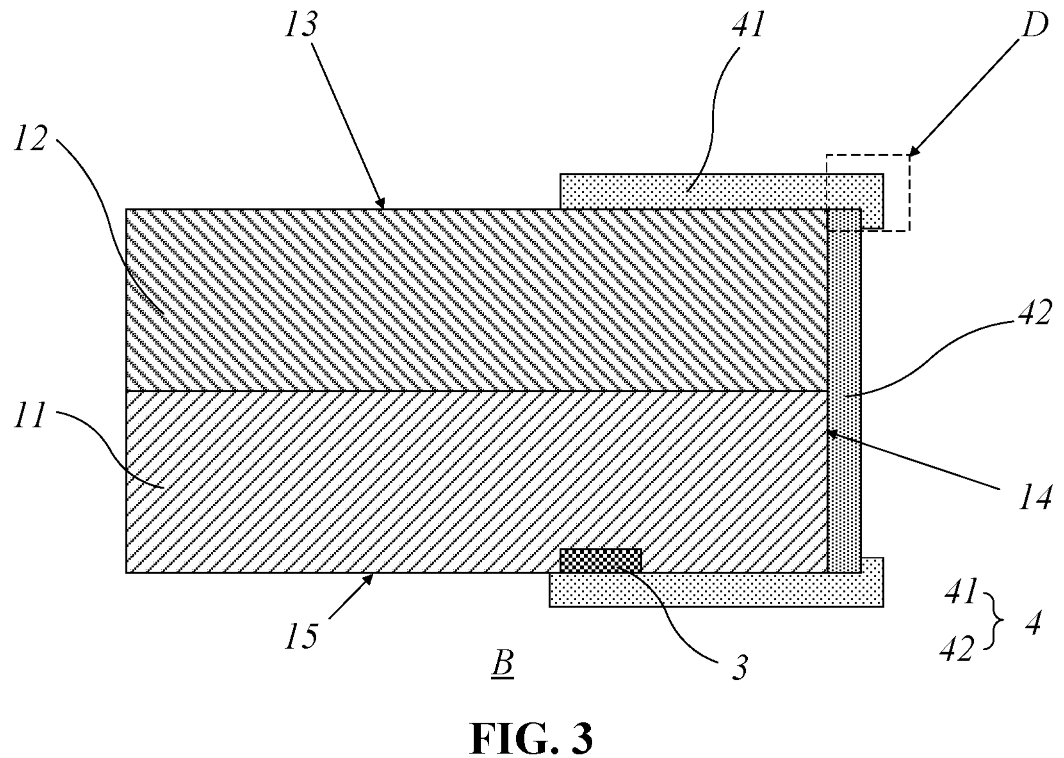
FIG. 3 is another partial enlarged view of a region B of the display panel shown in FIG. 1 according to an embodiment of the present disclosure.
Figure 4:
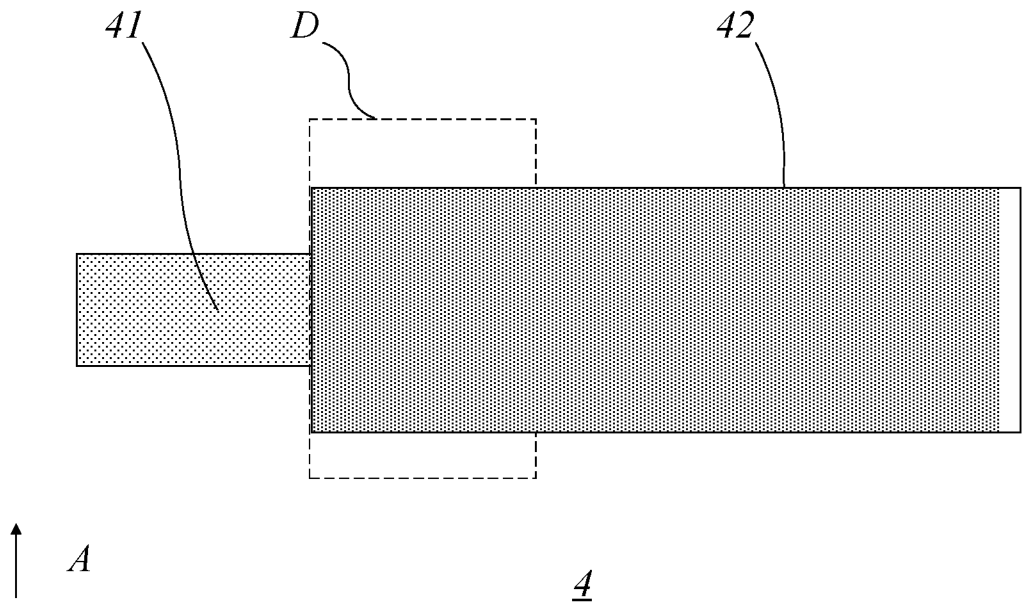
FIG. 4 is a view of an unfolded signal line of a display panel according to an embodiment of the present disclosure.

FIG. 1 is a structural view of a display panel according to an embodiment of the present disclosure. FIG. 2 is a partial enlarged view of a region B of the display panel shown in FIG. 1 according to an embodiment of the present disclosure. FIG. 3 is another partial enlarged view of a region B of the display panel shown in FIG. 1 according to an embodiment of the present disclosure. FIG. 4 is a view of an unfolded signal line of a display panel according to an embodiment of the present disclosure.

With reference to FIG. 1 to FIG. 4, a display panel is provided in an embodiment of the present disclosure and includes an array substrate 1, a light-emitting element 2, a plurality of first connection pads 3, and a signal line 4. The array substrate 1 includes a substrate 11 and an array layer 12, and the array layer 12 is disposed on one side of the substrate 11 and includes a pixel circuit. The light-emitting element 2 is disposed on one side of the array layer 12 facing away from the substrate 11. The plurality of first connection pads 3 are disposed on the substrate 11 and coupled to the pixel circuit. The signal line 4 includes a first wire segment 41 and a second wire segment 42, the first wire segment 41 is configured to connect a first connection pad 3 and the second wire segment 42, or the second wire segment 42 is configured to connect a first connection pad 3 and the first wire segment 41. The display panel further includes an overlapping region D. In the overlapping region D, the first wire segment 41 and the second wire segment 42 at least partially overlap in a direction perpendicular to a plane where the signal line 4 is located. In the overlapping region D, a width of the first wire segment 41 is different from a width of the second wire segment 42 in a first direction A. The first direction A is perpendicular to an extension direction of the signal line 4.

The substrate 11 may be formed of a polymer material such as glass, polyimide (PI), polycarbonate (PC), polyether sulfone (PES), polyethylene terephthalate (PET), polyethylene naphthalate (PEN), polyarylates (PAR), glass fiber reinforced plastic (FRP) or the like. The substrate 11 may be transparent, translucent or opaque.

The light-emitting element 2 may be a micro light-emitting diode (microLED) or a mini light-emitting diode (mini LED). For convenience of illustration, a flip-chip micro light-emitting diode as the light-emitting element 2 is used as an example in the embodiment of the present disclosure.

The array layer 12 is disposed on the side of the substrate 11 and includes the pixel circuit configured for controlling and driving the light-emitting element 2. The pixel circuit may include a thin-film transistor (TFT). The plurality of first connection pads 3 are coupled to the pixel circuit. It is to be noted that the first connection pad 3 may be disposed on the side of the substrate 11 facing away from the array layer 12; in this case, the first connection pad 3 is indirectly connected to the pixel circuit through the signal line 4. The first connection pad 3 may be disposed on the side of the substrate 11 facing towards the array layer 12; in this case, the first connection pad 3 is directly connected to the pixel circuit.

Still referring to FIG. 2 and FIG. 3, the signal line 4 is configured to transmit a drive signal to the pixel circuit. It is to be noted that a part of the signal line 4 is disposed on the side of the array substrate 1 facing towards the light-emitting element 2, another part of the signal line 4 is disposed on the side of the array substrate 1 facing away from the light-emitting element 2, and another part of the signal line 4 crosses one side surface of the array substrate 1. The first wire segment 41 of the signal line 4 may be any part of the preceding three parts, the second wire segment 42 may be any part of the preceding three parts, and the first wire segment 41 and the second wire segment 42 are connected to each other. The first wire segment 41 connects the first connection pad 3 and the second wire segment 42, that is, the first connection pad 3, the first wire segment 41 and the second wire segment 42 may be connected in sequence. Alternatively, the second wire segment 42 connects the first connection pad 3 and the first wire segment 41, that is, the first connection pad 3, the second wire segment 42 and the first wire segment 41 are connected in sequence. In the embodiment of the present disclosure, the first direction A is perpendicular to the extension direction of the signal line 4, that is, the first direction A is the width direction of the signal line 4.

The first wire segment 41 and the second wire segment 42 overlap in the overlapping region D of the display panel so that the first wire segment 41 and the second wire segment 42 can be lapped together. It is to be noted that the signal line 4 is not a signal line 4 on a certain plane, but a signal line 4 on multiple planes. In a case where the overlapping region D is located on a certain flat surface, the direction perpendicular to the plane where the signal line 4 is located refers to the direction perpendicular to the flat surface. In a case where the overlapping region D is located on a certain curved surface, the direction perpendicular to the plane where the signal line 4 is located refers to the direction perpendicular to the tangent plane of the curved surface at the overlapping place. It is to be understood that after the signal line 4 is unfolded to one plane, the direction perpendicular to the plane where the signal line 4 is located refers to the direction perpendicular to the unfolded plane. In the overlapping region D, the width of the first wire segment 41 is different from the width of the second wire segment 42 in the first direction A. In the overlapping region D, in an ideal state, the width of the first wire segment 41 is greater than the width of the second wire segment 42, and the width of the overlapping place of the first wire segment 41 and the second wire segment 42 is equal to the width of the second wire segment 42; alternatively, the width of the first wire segment 41 is less than the width of the second wire segment 42, and the width of the overlapping place of the first wire segment 41 and the second wire segment 42 is equal to the width of the first wire segment 41. When the display panel provided in the embodiment of the present disclosure is manufactured, the first wire segment 41 and the second wire segment 42 are manufactured by two processes separately, so a locating error may exist in the first direction A when the first wire segment 41 and the second wire segment 42 are aligned. However, in the overlapping region D, the first wire segment 41 and the second wire segment 42 have a width difference. Even if a certain error exists, the width of the overlapping place of the first wire segment 41 and the second wire segment 42 can still be equal to the width of the overlapping place of the first wire segment 41 and the second wire segment 42 in an ideal state. Therefore, good stability of physical connection and electrical connection is provided at the joint of the first wire segment 41 and the second wire segment 42, improving the yield of the display panel. Additionally, a certain error of locating between the first wire segment 41 and the second wire segment 42 is allowed, which is equivalent to increasing the upper limit of the error of locating between the first wire segment 41 and the second wire segment 42, reducing the process locating requirements of the first wire segment 41 and the second wire segment 42, and thereby reducing the production cost of the display panel.

Further, still referring to FIG. 2 to FIG. 4, the array substrate 1 includes a first surface 13, a second surface 14 and a third surface 15. The first surface 13, the second surface 14 and the third surface 15 are connected to each other. The first surface 13 is a surface disposed on the side of the array layer 12 facing away from the substrate 11. The third surface 15 is a surface on one side of the substrate 11 facing away from the array layer 12. The second surface 14 is disposed on one side of the array substrate 1 perpendicular to a thickness direction of the display panel. At least part of the first wire segment 41 is disposed on the first surface 13 or the third surface 15, and at least part of the second wire segment 42 is disposed on the second surface 14. At least part of the overlapping region D is disposed on at least one of the first surface 13 or the second surface 14.

The first surface 13 and the third surface 15 of the array substrate 1 are two opposite surfaces along the thickness direction of the array substrate 1. The first surface 13 is the surface disposed on the side of the array layer 12 facing away from the substrate 11. The third surface 15 is the surface disposed on the side of the substrate 11 facing away from the array layer 12. The light-emitting element 2 is disposed on the first surface 13. The second surface 14 of the array substrate 1 is disposed on one side of the array substrate 1 perpendicular to the thickness direction of the display panel. It is considered that the signal line 4 is used for transmitting the drive signal from the third surface 15 of the array substrate 1 to the first surface 13. At least part of the first wire segment 41 is disposed on the first surface 13 or the third surface 15, and at least part of the second wire segment 42 is disposed on the second surface 14. The first wire segment 41 and the second wire segment 42 overlap in the overlapping region D, so at least part of the overlapping region D is disposed on at least one of the first surface 13 or the second surface 14. That is, the overlapping region D may be located entirely on the first surface 13, may be located partially on the first surface 13 and partially on the second surface 14, or may be located entirely on the second surface 14.

It is to be noted that in a case where at least part of the first wire segment 41 is disposed on the first surface 13 and at least part of the second wire segment 42 is disposed on the second surface 14, the signal line 4 may also include a wire segment disposed on the third surface 15. The wire segment disposed on the third surface 15 is connected to the second wire segment 42. For the arrangement between the wire segment disposed on the third surface 15 and the second wire segment 42, reference may be made to the arrangement between the first wire segment 41 and the second wire segment 42.

Figure 5:
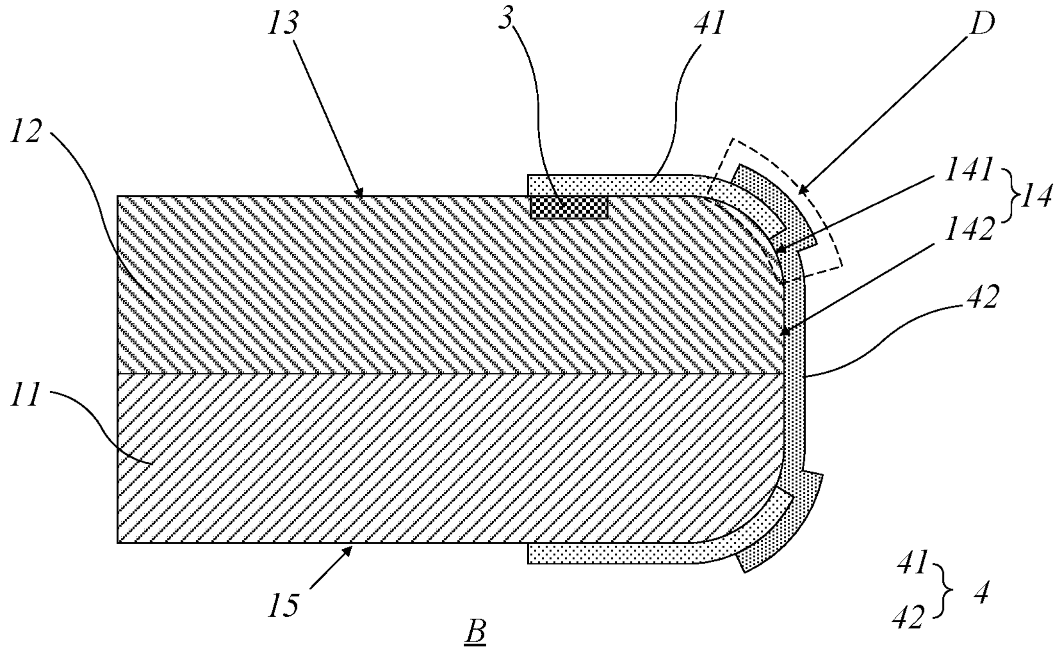
FIG. 5 is another partial enlarged view of a region B of the display panel shown in FIG. 1 according to an embodiment of the present disclosure.

FIG. 5 is another partial enlarged view of a region B of the display panel shown in FIG. 1 according to an embodiment of the present disclosure.

Further, with reference to FIG. 5, the second surface 14 further includes a first chamfer portion 141 and a flat portion 142. The first chamfer portion 141 is configured to connect the first surface 13 and the flat portion 142. The overlapping region D is disposed on at least one of the first chamfer portion 141 or the first surface 13.

The first chamfer portion 141 may be provided at a place of the second surface 14 closer to the first surface 13. Accordingly, the part of the second surface 14 parallel to the thickness direction of the display panel is the flat portion 142. The first chamfer portion 141 may act as a transition region between the first surface 13 and the flat portion 142. The overlapping region D may be disposed on the first chamfer portion 141, may be disposed on the first surface 13, or may be located partially on the first surface 13 and partially on the first chamfer portion 141.

Further, still referring to FIG. 5, the overlapping region D is disposed on the first chamfer portion 141.

Most of the first wire segment 41 is disposed on the first surface 13, and most of the second wire segment 42 is disposed on the flat portion 142. In a case where the overlapping region D is disposed on the first chamfer portion 141, the first wire segment 41 may be prepared in the direction perpendicular to the first surface 13, a part of the first wire segment 41 may be disposed on the first chamfer portion 141, the second wire segment 42 may be prepared in the direction perpendicular to the flat portion 142, and a part of the second wire segment 42 may be disposed on the first chamfer portion, so that the first wire segment 41 and the second wire segment 42 may overlap on the first chamfer portion 141 to form the overlapping region D. The overlapping region D is disposed on the first chamfer portion 141, thereby reducing the difficulty in preparing the signal line 4, and simplifying the preparation process of the display panel provided in the embodiment of the present disclosure.

Figure 6:
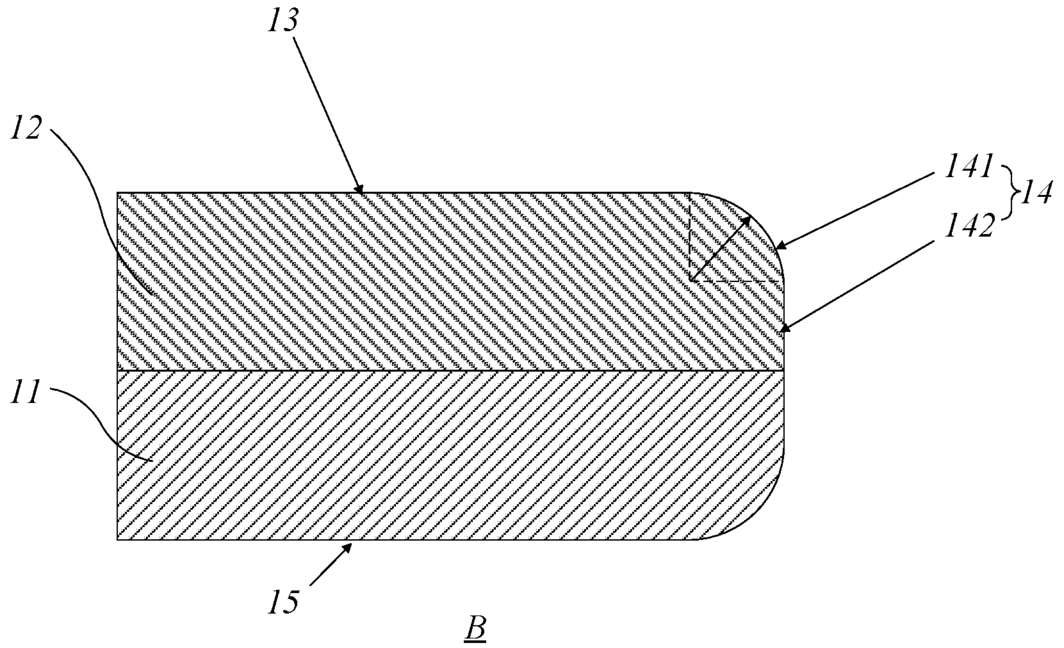
FIG. 6 is a partial enlarged view of an array substrate in a region B of the display panel shown in FIG. 1 according to an embodiment of the present disclosure.
Figure 7:
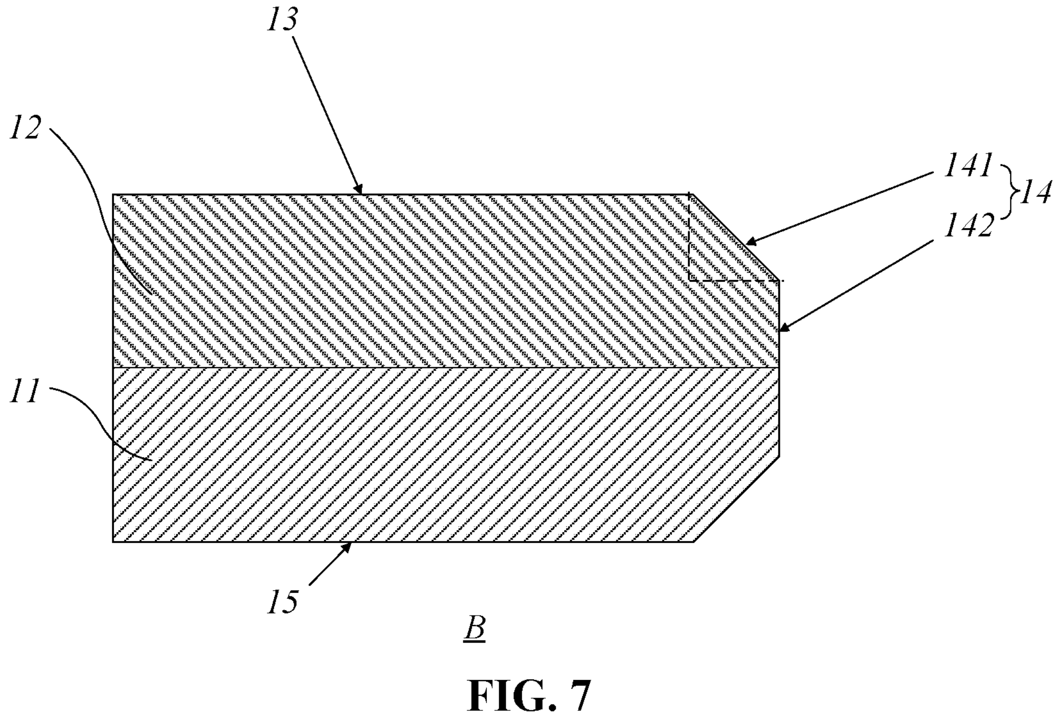
FIG. 7 is a partial enlarged view of an array substrate in a region B of the display panel shown in FIG. 1 according to an embodiment of the present disclosure.

FIG. 6 is a partial enlarged view of an array substrate in a region B of the display panel shown in FIG. 1 according to an embodiment of the present disclosure. FIG. 7 is a partial enlarged view of an array substrate in a region B of the display panel shown in FIG. 1 according to an embodiment of the present disclosure.

Further, with reference to FIG. 6 and FIG. 7, the first chamfer portion 141 is a circular arc surface with an arc radius less than or equal to 0.25 mm. Alternatively, the first chamfer portion 141 is an inclined surface, and a height and a width of the inclined surface are less than or equal to 0.25 mm.

In the embodiment of the present disclosure, the first chamfer portion 141 may be a circular arc surface with an arc radius not greater than 0.25 mm. The first chamfer portion 141 may also be an inclined surface, and a height and a width of the inclined surface are not greater than 0.25 mm. The width of the projection of the first chamfer portion 141 is not greater than 0.25 mm in the direction perpendicular to the first surface 13, and the width of the projection of the first chamfer portion 141 is not greater than 0.25 mm in the direction perpendicular to the flat portion 142, so that the influence of the first chamfer portion 141 on the structures on the first surface 13 and the flat portion 142 can be reduced.

Figure 8:
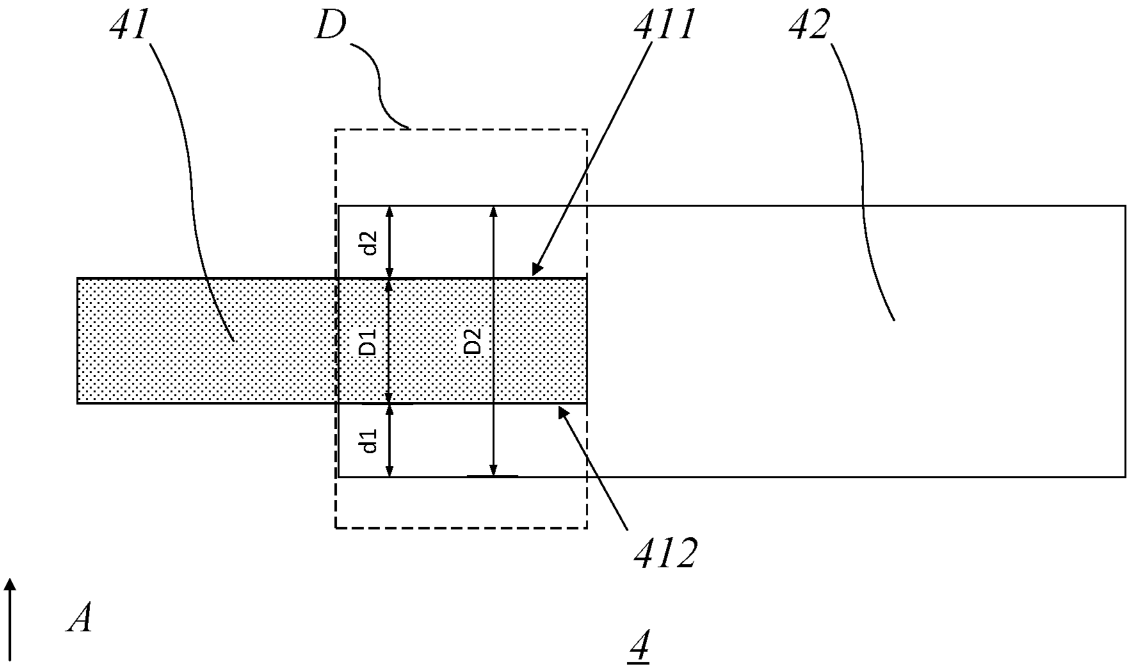
FIG. 8 is another view of an unfolded signal line of a display panel according to an embodiment of the present disclosure.
Figure 9:
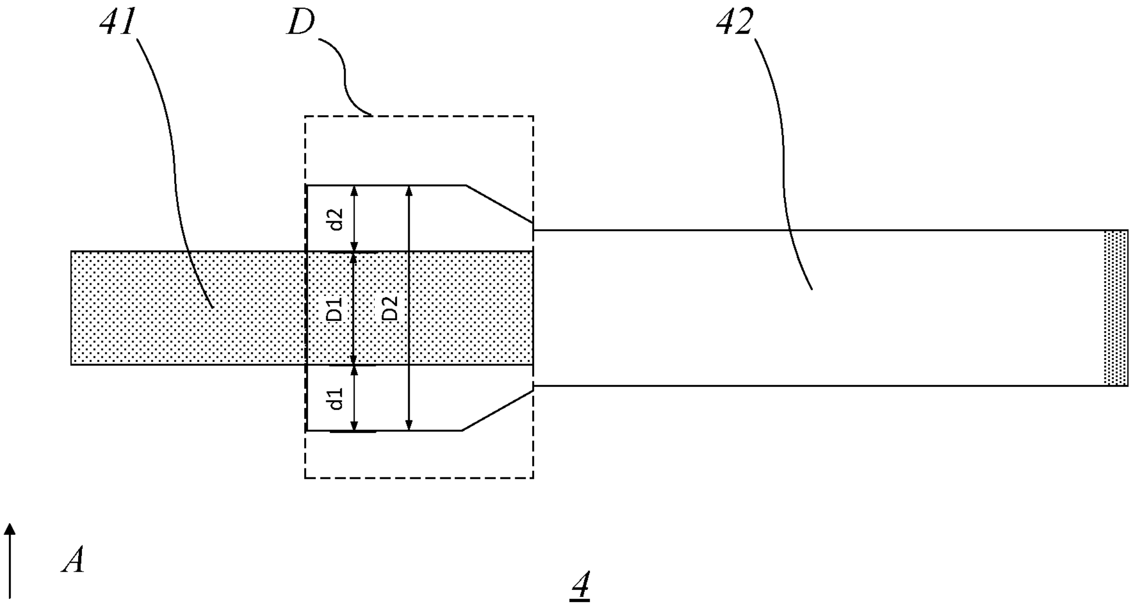
FIG. 9 is another view of an unfolded signal line of a display panel according to an embodiment of the present disclosure.

FIG. 8 is another view of an unfolded signal line of a display panel according to an embodiment of the present disclosure. FIG. 9 is another view of an unfolded signal line of a display panel according to an embodiment of the present disclosure.

Further, with reference to FIG. 8 and FIG. 9, in the overlapping region D and in the first direction A, a maximum width of the first wire segment 41 is D1 and a maximum width of the second wire segment 42 is D2. D1<D2.

In the embodiment of the present disclosure, in the overlapping region D and in the first direction A, by way of example, the maximum width D1 of the first wire segment 41 is less than the width D2 of the second wire segment 42. In the overlapping region D, the width of the first wire segment 41 may vary and may be different at a different position. Similarly, in the overlapping region D, the width of the second wire segment 42 may vary and may be different at a different position. Since the maximum width D1 of the first wire segment 41 is less than the width D2 of the second wire segment 42, the actual overlapping part of the first wire segment 41 and the second wire segment 42 has a width D2. The upper limit of the error of locating between the first wire segment 41 and the second wire segment 42 may be increased by (D1−D2) on the basis of the original upper limit of the locating error.

Further, with reference to FIG. 8, in the overlapping region D and in the first direction A, the width of the first wire segment 41 is a fixed value and the width of the second wire segment 42 is a fixed value.

The width of the first wire segment 41 is a fixed value, that is, the first wire segment 41 may be regarded as a line of equal width in the overlapping region D. It is to be noted that the width of the first wire segment 41 outside the overlapping region D may vary and may be different from the width of the first wire segment 41 inside the overlapping region D. Similarly, the width of the second wire segment 42 is a fixed value, that is, the second wire segment 42 may be regarded as a line of equal width in the overlapping region D. It is to be noted that the width of the second wire segment 42 outside the overlapping region D may vary and may be different from the width of the second wire segment 42 inside the overlapping region D. Furthermore, outside the overlapping region D, the width of the first wire segment 41 and the width of the second wire segment 42 are not limited and may be equal or not equal.

Figure 10:
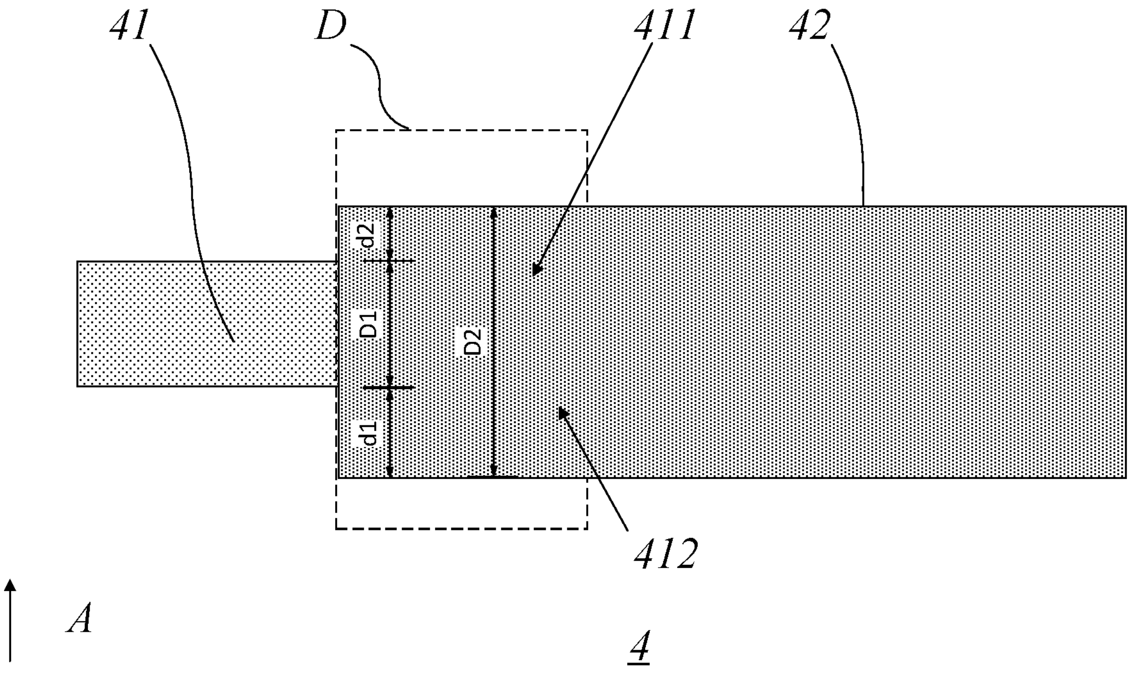
FIG. 10 is another view of an unfolded signal line of a display panel according to an embodiment of the present disclosure.

FIG. 10 is another view of an unfolded signal line of a display panel according to an embodiment of the present disclosure.

Further, with reference to FIG. 10 and in combination with FIG. 8 and FIG. 9, in the overlapping region D and in the first direction A, a shortest distance from a first edge 411 of the first wire segment 41 to an edge of the second wire segment 42 is dl, and a shortest distance from a second edge 412 of the second wire segment 41 to an edge of the second wire segment 42 is d2. d2≥d1≥0, and d2 and d1 are not zero at the same time.

In the overlapping region D, the first wire segment 41 has a width D1 and has two side edges in the first direction A, that is, a first edge 411 and a second edge 412. The shortest distance from the first edge 411 of the first wire segment 41 to the edge of the second wire segment 42 is d1, and d1≥0. The shortest distance from the second edge 412 of the second wire segment 41 to the edge of the second wire segment 42 is d2, and d2≥0. d2 and d1 are not zero at the same time. That is, on the premise that the first wire segment 41 and the second wire segment 42 are electrically well connected, on the second wire segment 42, at least one of the side facing towards the first edge 411 and away from the second edge 412 or the side facing towards the second edge 412 away from the first edge 411 remains in a part where the second wire segment 42 does not overlap the first wire segment 41. Since d2≥d1, the center line of the first wire segment 41 and the center line of the second wire segment 42 may or may not be aligned.

Figure 11:
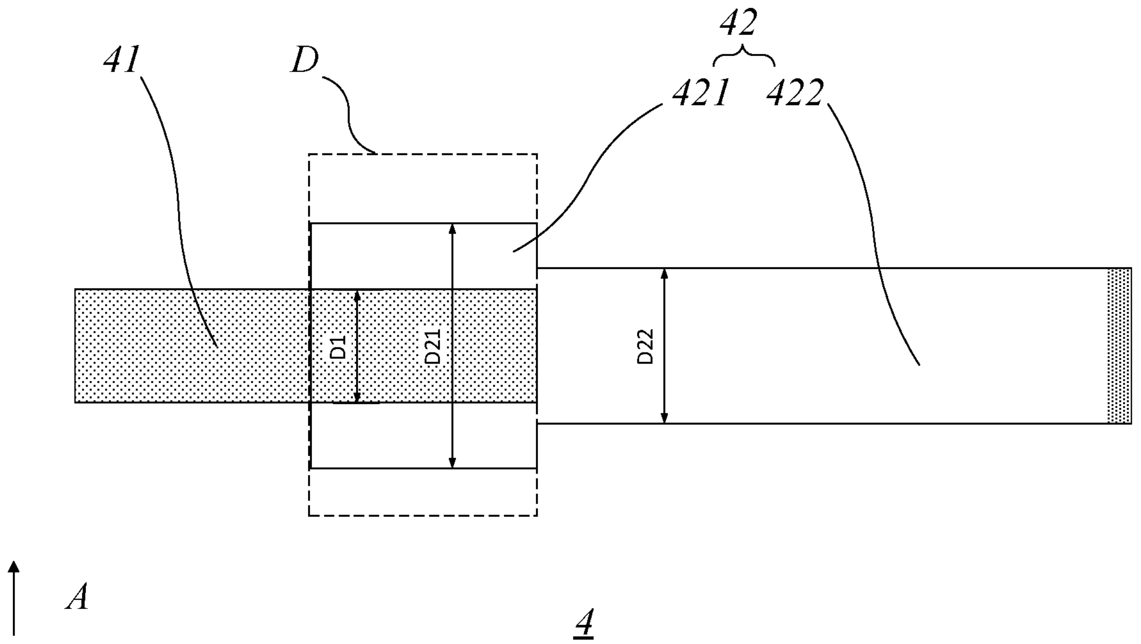
FIG. 11 is another view of an unfolded signal line of a display panel according to an embodiment of the present disclosure.

FIG. 11 is another view of an unfolded signal line of a display panel according to an embodiment of the present disclosure.

Further, with reference to FIG. 11, the second wire segment 42 includes a first sub-portion 421 and a second sub-portion 422. The first sub-portion 421 is located in the overlapping region. The second sub-portion 422 is disposed on one side of the first sub-portion 421 facing away from the first wire segment 41. In the first direction A, a width of the first sub-portion 421 is D21 and a width of the second sub-portion 422 is D22. D21≥D22.

In the extension direction of the second wire segment 42, the second wire segment 42 includes a first sub-portion 421 and a second sub-portion 422. The first sub-portion 421 is located in the overlapping region D and the second sub-portion 422 is located outside the overlapping region D. The second wire segment 42 may be regarded as a plurality of wires having varying widths. The width D21 of the first sub-portion 421 is greater than the width D1 of the first wire segment 41. The width D22 of the second sub-portion 422 may be less than the width D21 of the first sub-portion 421, that is, the width of the second wire segment 42 in the overlapping region D is larger. The relationship between the width D22 of the second sub-portion 422 and the width D1 of the first wire segment 41 is not limited. The width D22 of the second sub-portion 422 may be less than the width D21 of the first sub-portion 421, that is, the widths of the second wire segment 42 inside and outside of the overlapping region D are the same.

Figure 12:
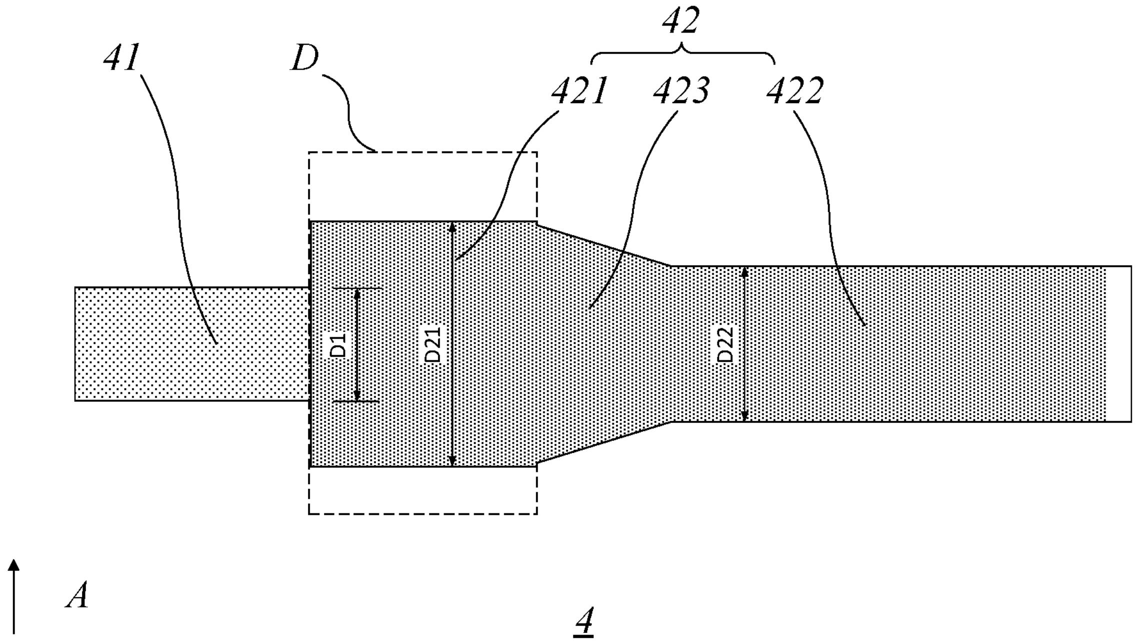
FIG. 12 is another view of an unfolded signal line of a display panel according to an embodiment of the present disclosure.

FIG. 12 is another view of an unfolded signal line of a display panel according to an embodiment of the present disclosure.

Further, with reference to FIG. 12, the second wire segment 42 includes a third sub-portion 423 located between the first sub-portion 421 and the second sub-portion 422, and a width of the third sub-portion 423 varies in the first direction A.

In the second wire segment 42, the first sub-portion 421, the third sub-portion 423 and the second sub-portion 422 are connected in sequence. The first sub-portion 421 is located inside the overlapping region D. The second sub-portion 422 is located outside the overlapping region D. The third sub-portion 423 may be located entirely inside the overlapping region D, may be located partially inside the overlapping region D, or may be located entirely outside the overlapping region D. The width of the third sub-portion 423 varies. In a case where the width D22 of the second sub-portion 422 may be less than the width D21 of the first sub-portion 421, the third sub-portion 423 corresponds to a transition portion between the first sub-portion 421 and the second sub-portion 422. The width of the third sub-portion 423 may uniformly vary to form a regular trapezoid, which is convenient for preparation. Two side edges of the third sub-portion 423 in the first direction A may be convex curves, increasing the average width of the second wire segment 42, and thereby reducing the resistance of the second wire segment 42 and reducing the power consumption of the display panel provided in the embodiment of the present disclosure. The two side edges of the third sub-portion 423 in the first direction A may be concave curves, reducing the material consumption of the second wire segment 42, and thereby reducing the preparation cost of the display panel provided in the embodiment of the present disclosure.

Figure 13:
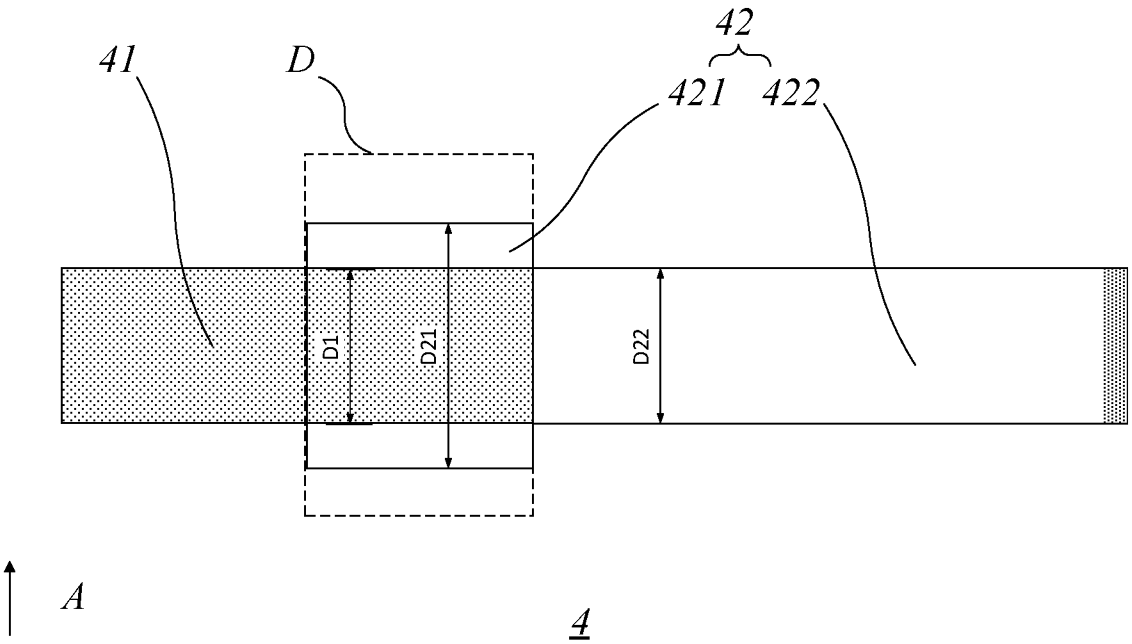
FIG. 13 is another view of an unfolded signal line of a display panel according to an embodiment of the present disclosure.

FIG. 13 is another view of an unfolded signal line of a display panel according to an embodiment of the present disclosure.

Further, with reference to FIG. 13, in the first direction A, the width D22 of the second sub-portion 422 and the width D1 of the first wire segment 41 satisfy the equation D22=D1.

In the embodiment of the present disclosure, the width D22 of the second sub-portion 422 is equal to the width D1 of the first wire segment 41, and the width D21 of the first sub-portion 421 is greater than the width D1 of the first wire segment 41. That is, the first wire segment 41 and the second sub-portion 422 may adopt the same line width, and a mere increase in the width of the first sub-portion 421 can reduce the occupation of space by the signal line 4.

Figure 14:
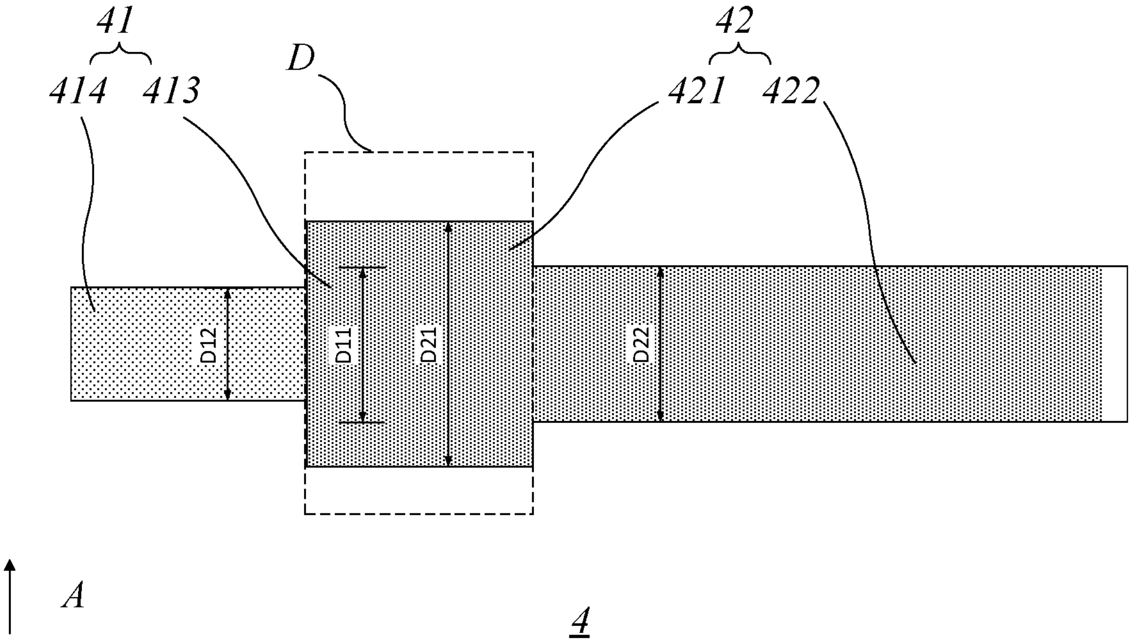
FIG. 14 is another view of an unfolded signal line of a display panel according to an embodiment of the present disclosure.

FIG. 14 is another view of an unfolded signal line of a display panel according to an embodiment of the present disclosure.

Further, with reference to FIG. 14, the first wire segment 41 includes a fourth sub-portion 413 and a fifth sub-portion 414. The fourth sub-portion 413 is located in the overlapping region D. The fifth sub-portion 414 is disposed on one side of the fourth sub-portion 413 facing away from the second wire segment 42. In the first direction A, a width of the fourth sub-portion 413 is D11 and a width of the fifth sub-portion 414 is D12, and D11 and D12 satisfy that D11≠D12.

In the extension direction of the first wire segment 41, the first wire segment 41 includes the fourth sub-portion 413 located inside the overlapping region D and the fifth sub-portion 414 located outside the overlapping region D. In the first direction A, the width D11 of the fourth sub-portion 413 may not be equal to the width D12 of the fifth sub-portion 414, that is, the first wire segment 41 may also be regarded as a plurality of wires having varying widths.

Figure 15:
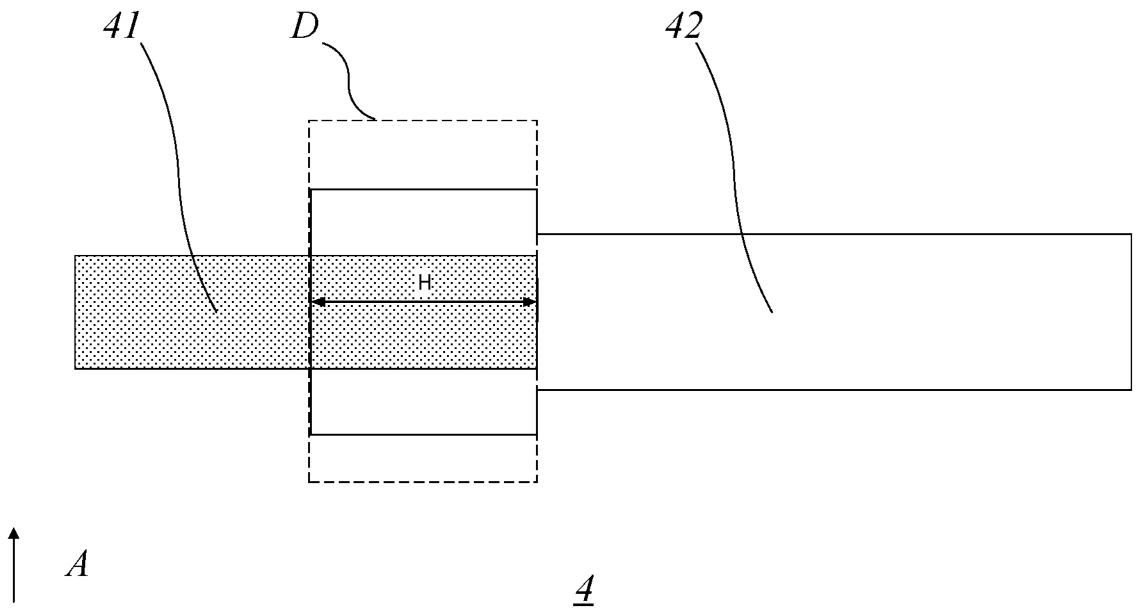
FIG. 15 is another view of an unfolded signal line of a display panel according to an embodiment of the present disclosure.

FIG. 15 is another view of an unfolded signal line of a display panel according to an embodiment of the present disclosure.

Further, with reference to FIG. 15, a width of the overlapping region D in the extension direction of the signal line 4 is H, and H≥5 μm.

The width H of the overlapping region D is greater than or equal to 5 μm in the extension direction of the signal line 4. That is, the distance between the end of the first wire segment 41 facing towards the second wire segment 42 and the end of the second wire segment 42 facing towards the first wire segment 41 in the extension direction of the signal line 4 is at least 5 μm. It is considered that the width of the first wire segment 41 is different from the width of the second wire segment 42 in the first direction A in the overlapping region D, and the width of the actual overlapping part of the first wire segment 41 and the second wire segment 42 can be made sufficiently large. In the embodiment of the present disclosure, the area of the actual overlapping part of the first wire segment 41 and the second wire segment 42 is large enough to enable good stability of physical connection and electrical connection at the joint of the first wire segment 41 and the second wire segment 42.

Figure 16:
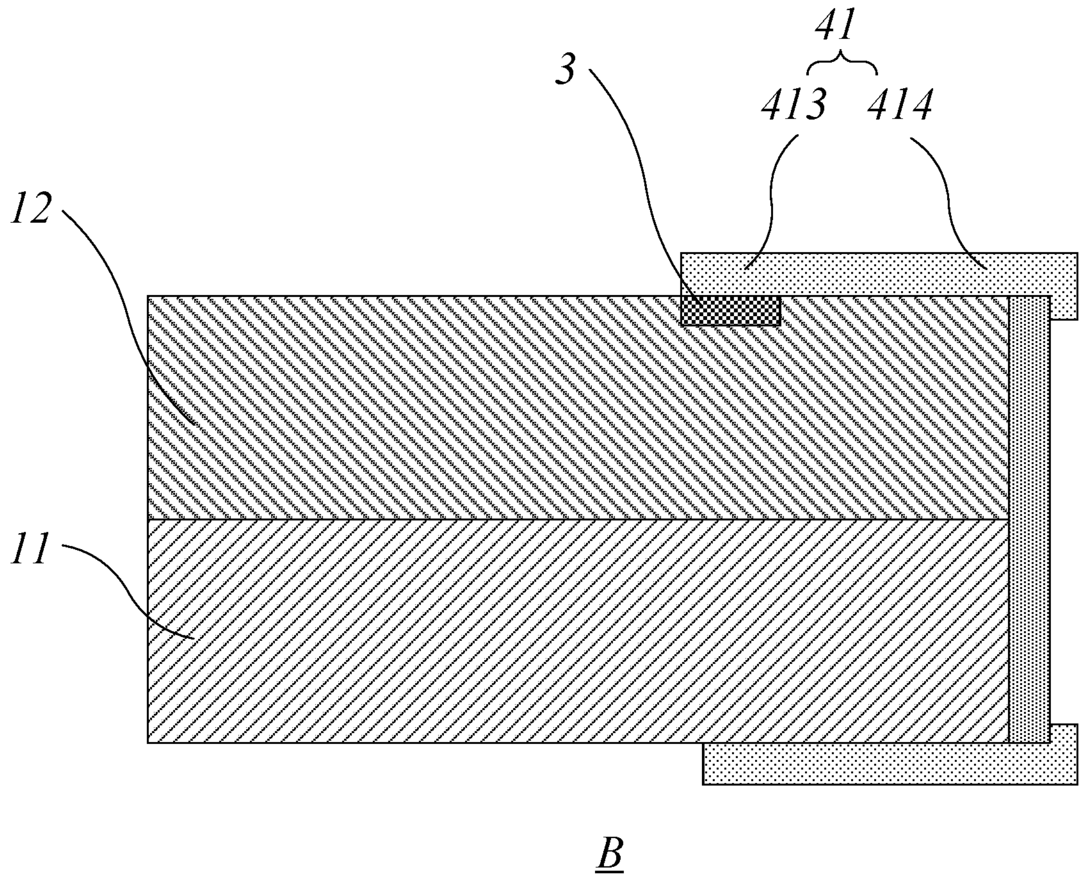
FIG. 16 is another partial enlarged view of a region B of the display panel shown in FIG. 1 according to an embodiment of the present disclosure.
Figure 17:
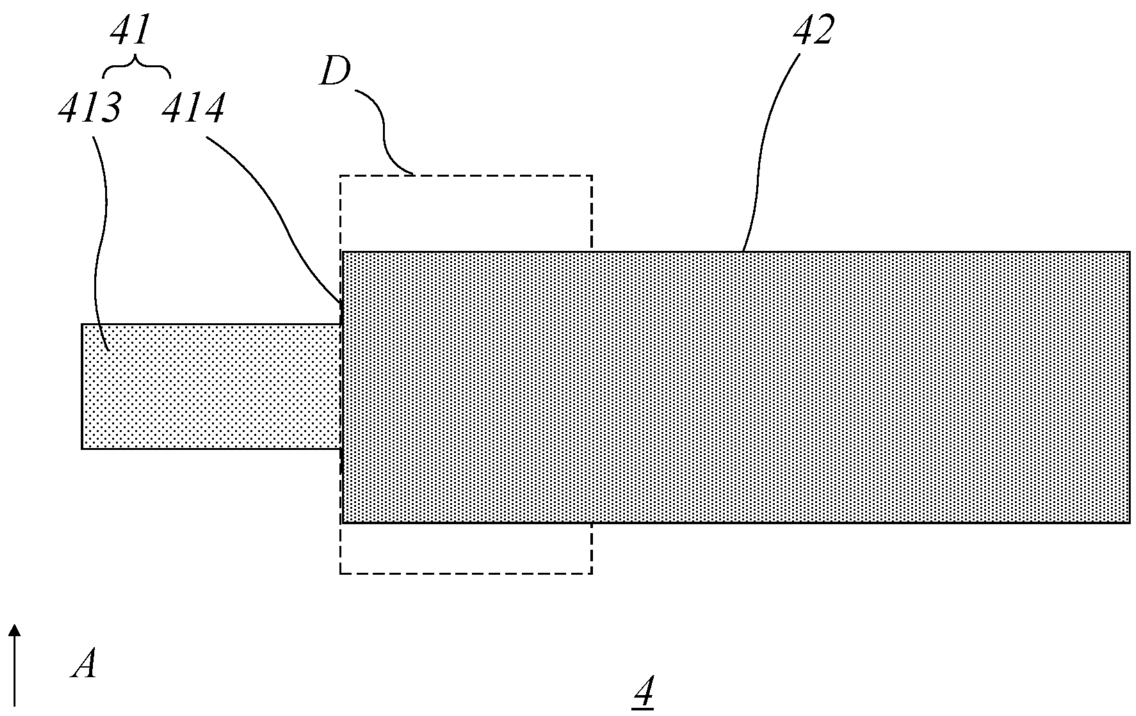
FIG. 17 is another view of an unfolded signal line of a display panel according to an embodiment of the present disclosure.

FIG. 16 is another partial enlarged view of a region B of the display panel shown in FIG. 1 according to an embodiment of the present disclosure. FIG. 17 is another view of an unfolded signal line of a display panel according to an embodiment of the present disclosure.

Further, with reference to FIG. 16 and FIG. 17, the first wire segment 41 includes a fourth sub-portion 413 and a fifth sub-portion 414, and the fourth sub-portion 413 and the fifth sub-portion 414 are connected to each other. The fourth sub-portion 413 is connected to the first connection pad 3. The fifth sub-portion 414 is connected to the second wire segment 42. In the first direction A, a width of the fourth sub-portion 413 is less than a width of the fifth sub-portion 414.

In the extension direction of the first wire segment 41, the first wire segment 41 includes the fourth sub-portion 413 located inside the overlapping region D and the fifth sub-portion 414 located outside the overlapping region D. The fourth sub-portion 413 is connected to the first connection pad 3, and the fifth sub-portion 414 is connected to the second wire segment 42, thereby achieving a connection between the signal line 4 and the first connection pad 3. In the first direction A, the width of the fourth sub-portion 413 is less than the width of the fifth sub-portion 414. The width of the first wire segment 41 is different from the width of the second wire segment 42 by an increase in the width of the fifth sub-portion 414.

Figure 18:
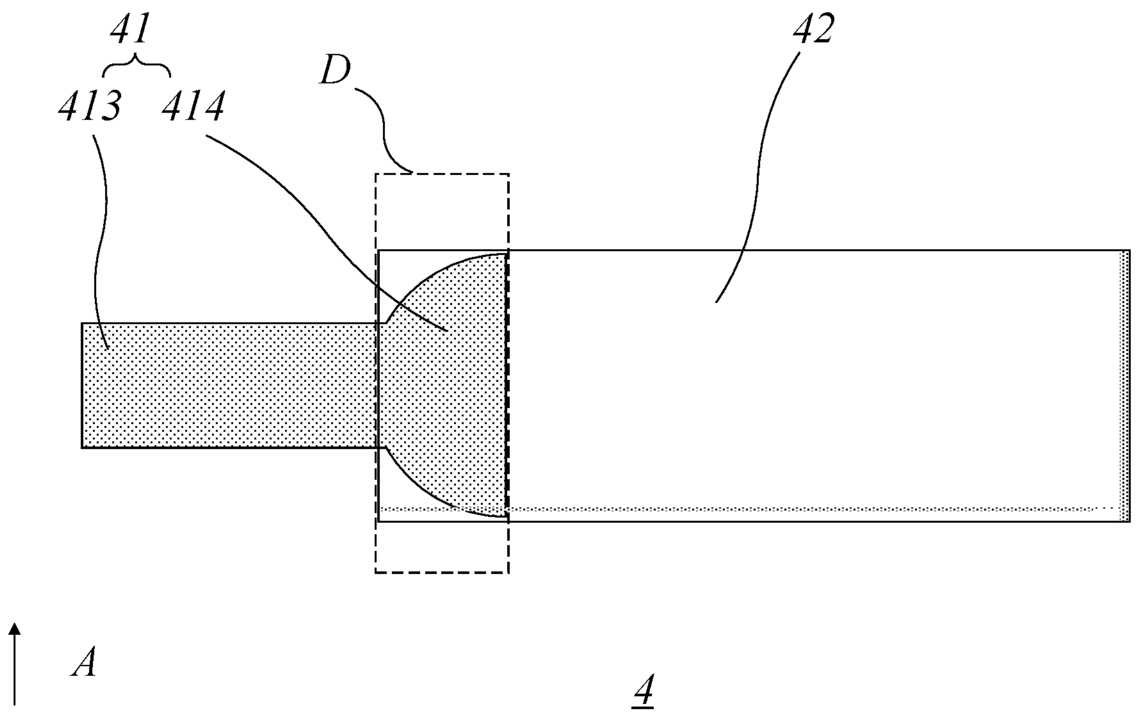
FIG. 18 is another view of an unfolded signal line of a display panel according to an embodiment of the present disclosure.

FIG. 18 is another view of an unfolded signal line of a display panel according to an embodiment of the present disclosure.

Further, with reference to FIG. 18, the fifth sub-portion 414 is in shape of a combination of at least one of an arch, an elliptic arch, or a polygon.

The fifth sub-portion 414 overlaps the second wire segment 42 in the overlapping region D. In the first direction A, the width of the fifth sub-portion 414 is greater than the width of the second wire segment 42. Exemplarily, the fifth sub-portion 414 is in shape of a combination of at least one of an arch, an elliptic arch, or a polygon.

Figure 19:
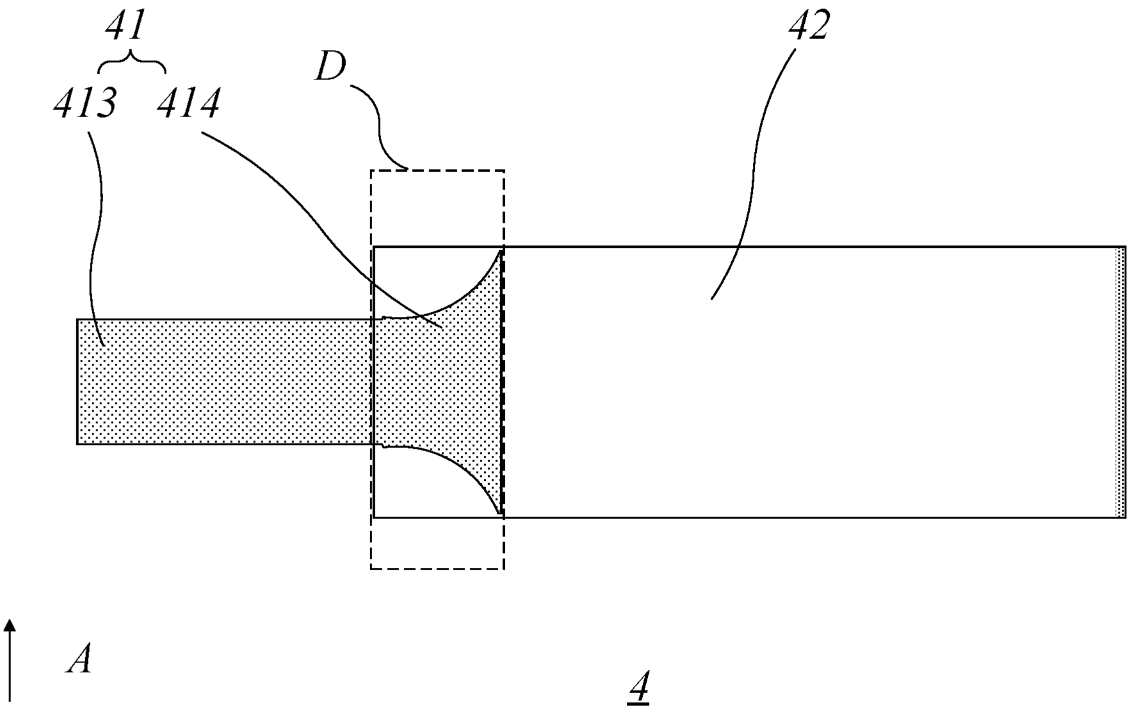
FIG. 19 is another view of an unfolded signal line of a display panel according to an embodiment of the present disclosure.

FIG. 19 is another view of an unfolded signal line of a display panel according to an embodiment of the present disclosure.

Further, with reference to FIG. 19, a width of at least part of the fifth sub-portion 414 gradually increases in a direction away from the fourth sub-portion 413; and in the first direction A, the fifth sub-portion 414 has one side edge which is a part of a concave curve.

In the first direction A, the maximum width of the fifth sub-portion 414 is greater than the width of the fourth sub-portion 413. The width of the fifth sub-portion 414 may gradually increase in the direction away from the fourth sub-portion 413 so that a gradual transition is provided between the fourth sub-portion 413 and the fifth sub-portion 414. Since the side edges of the fifth sub-portion 414 are concave curves, the material consumption of the fifth sub-portion 414 can be reduced, thereby further reducing the preparation cost of the display panel provided in the embodiment of the present disclosure.

Further, the signal line 4 includes at least one of a data signal line, a scan signal line, a positive power signal line, a negative power signal line, or a reset signal line.

A plurality of signal lines 4 may be provided and may transmit different signals. Specifically, the signal line 4 may include at least one of a data signal line Data, a scan signal line Gate, a positive power signal line PVDD, a negative power signal line PVEE, or a reset signal line REF.

Figure 20:
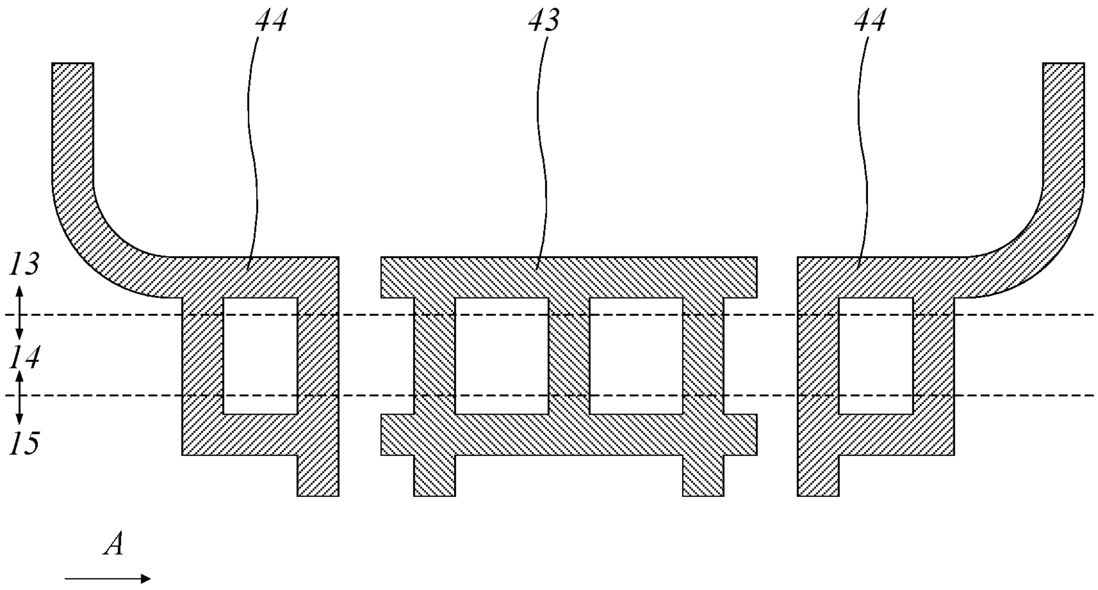
FIG. 20 is another view of an unfolded signal line of a display panel according to an embodiment of the present disclosure.

FIG. 20 is another view of an unfolded signal line of a display panel according to an embodiment of the present disclosure.

Further, with reference to FIG. 20, the positive power signal line 43 is located between two adjacent negative power signal lines 44 in the first direction A.

In the embodiment of the present disclosure, the signal line 4 includes the positive power signal line 43 and the negative power signal line 44 which are both configured to transmit signals from one side of the array substrate 1 to another side. At least two negative power signal lines 44 are provided and at least one positive power signal line 43 is provided. The positive power signal line 43 is located between two adjacent negative power signal lines 44 in the first direction A.

Figure 21:
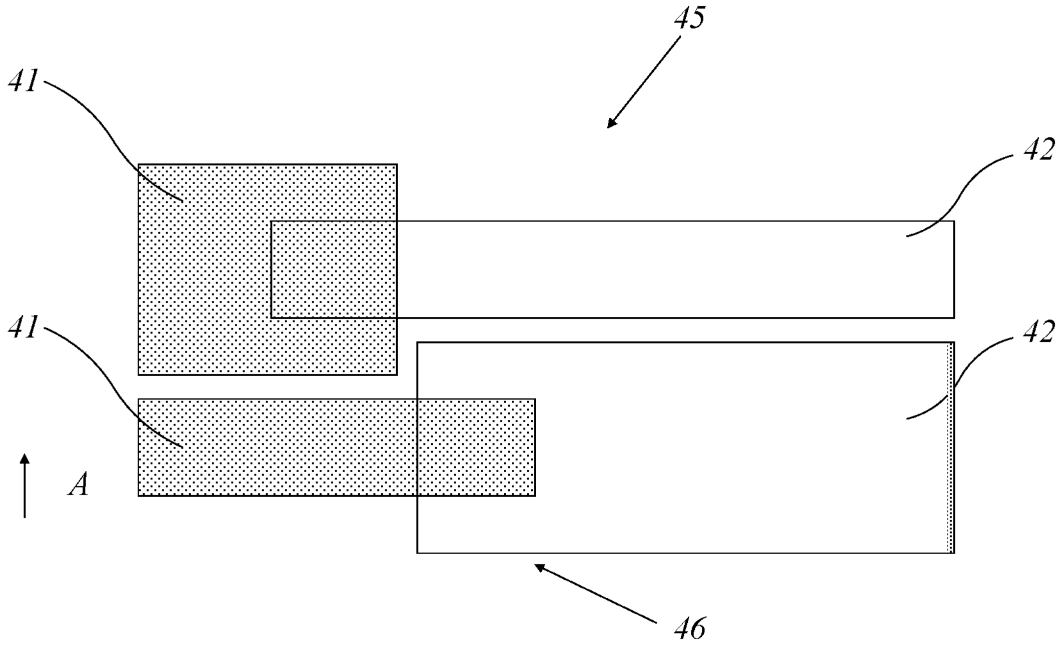
FIG. 21 is another view of an unfolded signal line of a display panel according to an embodiment of the present disclosure.

FIG. 21 is another view of an unfolded signal line of a display panel according to an embodiment of the present disclosure.

Further, with reference to FIG. 21, the signal line 4 includes a first-type signal line 45 and a second-type signal line 46. A width of a first wire segment 41 of the first-type signal line 45 is greater than a width of a second wire segment 42 of the first-type signal line 45 in the first direction A. A width of a first wire segment 41 of the second-type signal line 46 is less than a width of a second wire segment 42 of the second-type signal line 46 in the first direction A.

The signals transmitted by the first-type signal line 45 and the second-type signal line 46 may be the same or different. In the first direction A, the width of the first wire segment 41 of the first-type signal line 45 is greater than the width of the second wire segment 42 of the first-type signal line 45, and the width of the first wire segment 41 of the second-type signal line 46 is less than the width of the second wire segment 42 of the second-type signal line 46. Therefore, after the first-type signal line 45 and the second-type signal line 46 are arranged side by side, the space occupied in the first direction A is smaller, the arrangement space is saved, and the wire arrangement rate is improved.

Figure 22:
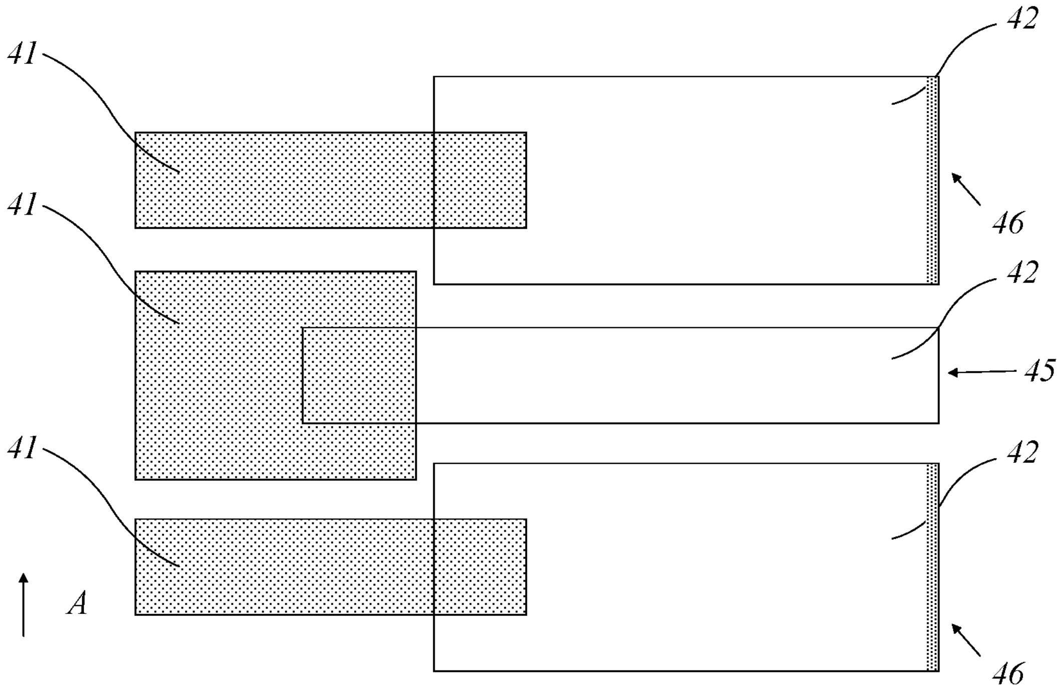
FIG. 22 is another view of an unfolded signal line of a display panel according to an embodiment of the present disclosure.

FIG. 22 is another view of an unfolded signal line of a display panel according to an embodiment of the present disclosure.

Further, with reference to FIG. 22, at least one second-type signal line 46 is included between two adjacent first-type signal lines 45 in the first direction A.

When the first-type signal line 45 is used for transmitting a negative power signal and the positive power signal line is used for transmitting a positive power signal, at least one second-type signal line 46 is included between two adjacent first-type signal lines 45 in the first direction A.

Further, still referring to FIG. 22, the first-type signal line 45 and the second-type signal line 46 are alternately arranged in the first direction A.

In a case where a plurality of first-type signal lines 45 and a plurality of second-type signal lines 46 are provided, the first-type signal lines 45 and the second-type signal lines 46 are alternately arranged, thereby further saving the arrangement space along the first direction A and further improving the wire arrangement rate.

Figure 23:
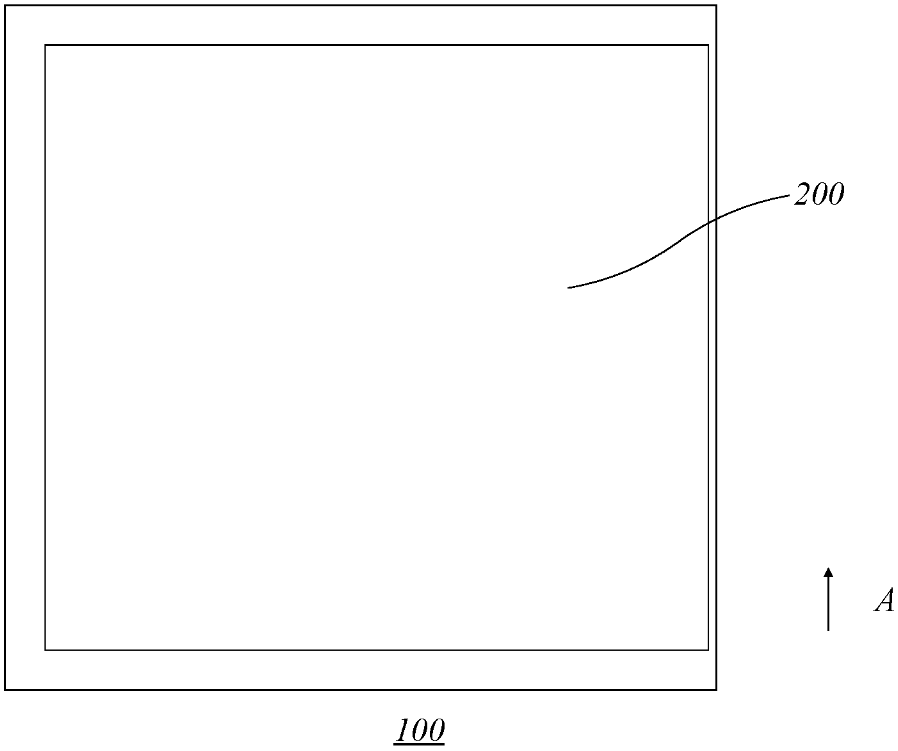
FIG. 23 is a structural view of a display device according to an embodiment of the present disclosure.

FIG. 23 is a structural view of a display device according to an embodiment of the present disclosure.

With reference to FIG. 23, an embodiment of the present disclosure further provides a display device 100. The display device 100 may include the display panel 200 provided in the preceding embodiments of the present disclosure. The display device 100 provided in the embodiment of the present disclosure may be any product or component having a display function, such as a mobile phone, a tablet computer, a television, a display, a notebook computer, a digital photo frame or a navigator.

Figure 24:
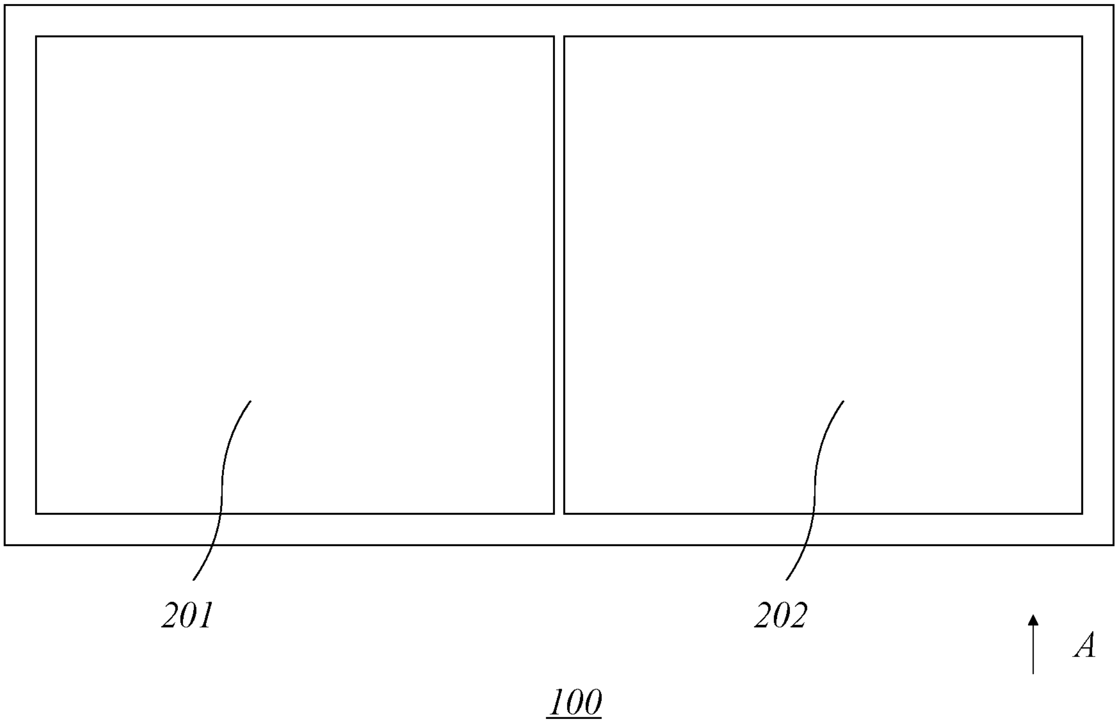
FIG. 24 is another structural view of a display device according to an embodiment of the present disclosure.

FIG. 24 is another structural view of a display device according to an embodiment of the present disclosure.

Further, with reference to FIG. 24, the display device 100 is a spliced display device. The spliced display device 100 includes at least two display panels 200. The display panel 200 includes a first display panel 201 and a second display panel 202. At least part of a signal line 4 of the first display panel 201 is disposed on one side of the first display panel 201 facing towards the second display panel 202. At least part of a signal line 4 of the second display panel 202 is disposed on one side of the second display panel 202 facing towards the first display panel 201. An orthographic projection of the signal line 4 of the first display panel 201 and an orthographic projection of the signal line 4 of the second display panel 202 are arranged at intervals in a direction perpendicular to a plane where a second wire segment 42 is located.

The display device 100 provided in the embodiment of the present disclosure is a spliced display device spliced by a plurality of display panels 200. The display panel 200 may include the first display panel 201 and the second display panel 202. The display panel 200 provided in the preceding embodiments of the present disclosure may be adopted as the first display panel 201 and the second display panel 202. At least part of the signal line 4 of the first display panel 201 is disposed on the side of the first display panel 201 facing towards the second display panel 202. At least part of the signal line 4 of the second display panel 202 is disposed on the side of the second display panel 202 facing towards the first display panel 201. The first display panel 201 and the second display panel 202 are spliced at side edges to form a splice seam. The second wire segment 42 of the signal line 4 of the first display panel 201 is located at the splice seam. The second wire segment 42 of the signal line 4 of the second display panel 202 is located at the splice seam. The orthographic projection of the signal line 4 of the first display panel 201 and the orthographic projection of the signal line 4 of the second display panel 202 are arranged at intervals in the direction perpendicular to the plane where the second wire segment 42 is located, so that the width of the splice seam can be reduced, and the display effect of the display device 100 at the splice seam according to the embodiment of the present disclosure can be improved.

Further, a plurality of signal lines 4 of the first display panel 201 are provided, a plurality of signal lines 4 of the second display panel 202 are provided, and the signal lines 4 of the first display panel 201 and the signal lines 4 of the second display panel 202 are alternately arranged in the first direction A.

Two adjacent signal lines 4 among the plurality of signal lines 4 of the first display panel 201 are spaced by one signal line 4 of the second display panel 202 such that the distance between the two signal lines 4 in the first direction A is increased. In consideration of an increase in the width of the first wire segment 41 or the second wire segment 42 in the first direction A, an increase in the distance between the two signal lines 4 in the first direction A can reduce the risk of short circuit between two adjacent signal lines 4 of the first display panel 201. Similarly, two adjacent signal lines 4 among the plurality of signal lines 4 of the second display panel 202 are spaced by one signal line 4 of the first display panel 202 such that the distance between the two signal lines 4 in the first direction A is increased, and the risk of short circuit between the two adjacent signal lines 4 of the second display panel 202 can be reduced.

Figure 25:
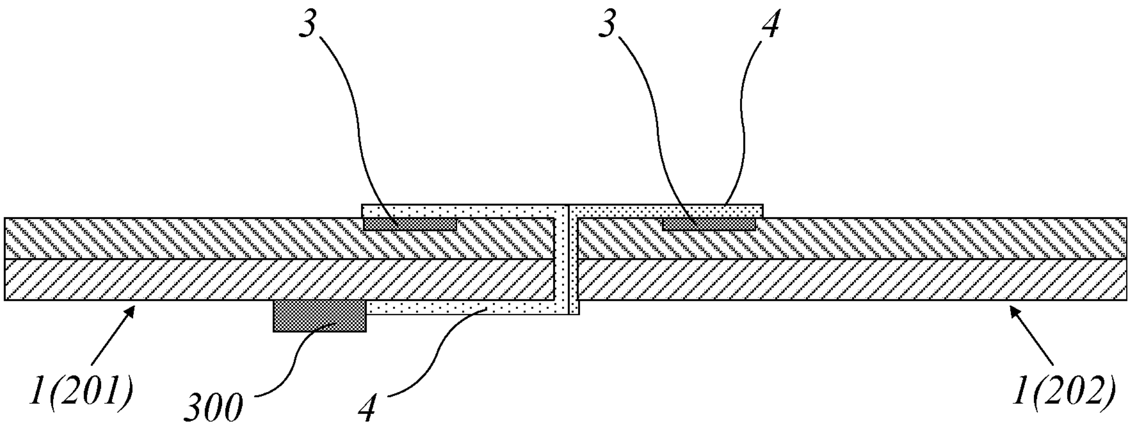
FIG. 25 is another structural view of a display device according to an embodiment of the present disclosure.

FIG. 25 is another structural view of a display device according to an embodiment of the present disclosure.

Further, with reference to FIG. 25, a driver chip 300 is further included and is disposed on one side of the substrate 11 facing away from the array layer 12. At least one driver chip 300 is provided. A first connection pad 3 of the first display panel 201 and a first connection pad 3 of the second display panel 202 each are electrically connected to the driver chip 300. In a plane where the substrate 11 is located, an orthographic projection of the driver chip 300 is located within an orthographic projection of the first display panel 201.

The driver chip 300 is used for transmitting a drive signal, and at least one driver chip 300 is provided. In the plane where the substrate 11 is located, the orthographic projection of the driver chip 300 is located in the orthographic projection of the first display panel 201, and the driver chip 300 is disposed on the side of the substrate 11 of the first display panel 201 facing away from the array layer 12. The first connection pad 3 of the first display panel 201 and the first connection pad 3 of the second display panel 202 each are electrically connected to the driver chip 300. The driver chip 300 may cooperatively control the display of the first display panel 201 and the display of the second display panel 202.

Figure 26:
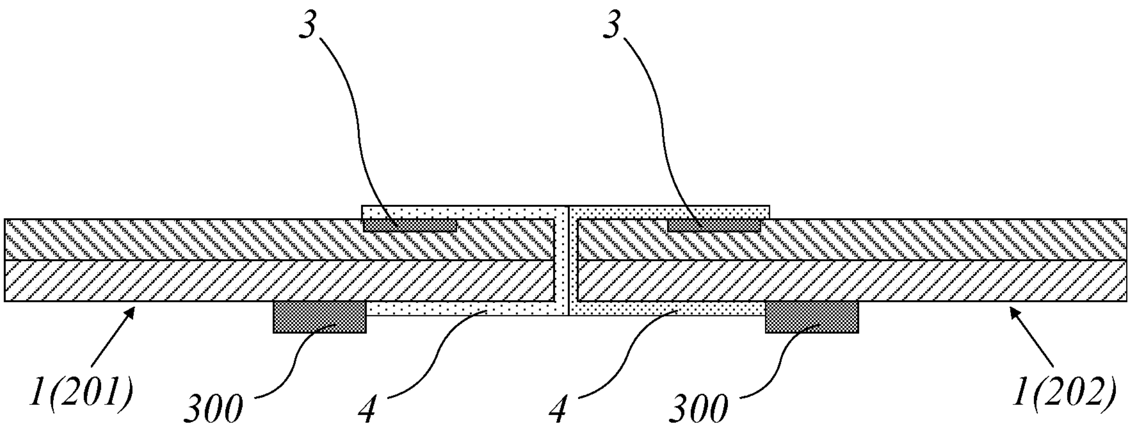
FIG. 26 is another structural view of a display device according to an embodiment of the present disclosure.

FIG. 26 is another structural view of a display device according to an embodiment of the present disclosure.

Further, with reference to FIG. 26, a driver chip 300 is further included and is disposed on one side of the substrate 11 facing away from the array layer 12. At least two driver chips 300 are provided. A first connection pad 3 of the first display panel 201 is electrically connected to one of the at least two driver chips 300; in a plane where the substrate 11 is located, an orthographic projection of the driver chip 300 is located within an orthographic projection of the first display panel 201. A first connection pad 3 of the second display panel 202 is electrically connected to another driver chip 300; in the plane where the substrate 11 is located, an orthographic projection of the driver chip 300 is located within an orthographic projection of the second display panel 202.

The driver chip 300 is used for transmitting a drive signal, and at least two driver chips 300 are provided. In the plane where the substrate 11 is located, the orthographic projection of one driver chip 300 is located in the orthographic projection of the first display panel 201. The driver chip 300 is disposed on the side of the substrate 11 of the first display panel 201 facing away from the array layer 12. . . . In the plane where the substrate 11 is located, the orthographic projection of another driver chip 300 is located in the orthographic projection of the second display panel 202. The driver chip 300 is disposed on the side of the substrate 11 of the second display panel 202 facing away from the array layer 12. The first connection pad 3 of the second display panel 202 is electrically connected to the driver chip 300. The driver chip 300 controls the display of the second display panel 202.

In view of the above, embodiments of the present disclosure provide the display panel and the display device. In the display panel, a signal is transmitted through a signal line. The first wire segment is configured to connect the first connection pad and the second wire segment, or the second wire segment is configured to connect the first connection pad and the first wire segment. The first wire segment and the second wire segment overlap in the overlapping region; and in the overlapping region, the width of the first wire segment is different from the width of the second wire segment in the first direction. Therefore, the first wire segment and the second wire segment have different widths when lapped, and redundant space is formed in the first direction. Even if a certain error of locating between the first wire segment and the second wire segment occurs in the first direction, the width of the overlapping part of the first wire segment and the second wire segment is enough to meet the connection requirements of the first wire segment and the second wire segment, so that good stability of physical connection and electrical connection is provided at the joint of the first wire segment and the second wire segment, improving the yield of the display panel, also increasing the upper limit of the error of locating between the first wire segment and the second wire segment, and further reducing the preparation cost of the display panel.

In summary, the above are merely preferred embodiments of the present disclosure and are not intended to limit the present disclosure. It is easy for those skilled in the art to conceive of various modifications or substitutions within the technical scope of the present disclosure. These modifications or substitutions are within the scope of the present disclosure. Therefore, the protection scope of the present disclosure is subject to the scope of the claims.

What is claimed is:

1. A display panel, comprising:

an array substrate comprising a substrate and an array layer, wherein the array layer is disposed on one side of the substrate and comprises a pixel circuit;

a light-emitting element disposed on one side of the array layer facing away from the substrate;

a plurality of first connection pads disposed on the substrate and coupled to the pixel circuit; and a signal line comprising a first wire segment and a second wire segment, wherein the first wire segment is configured to connect a first connection pad of the plurality of first connection pads and the second wire segment, or the second wire segment is configured to connect a first connection pad of the plurality of first connection pads and the first wire segment;

wherein the display panel further comprises an overlapping region, in the overlapping region, the first wire segment and the second wire segment at least partially overlap in a direction perpendicular to a plane where the signal line is located; in the overlapping region, a width of the first wire segment is different from a width of the second wire segment in a first direction, and the first direction is perpendicular to an extension direction of the signal line;

in the overlapping region and in the first direction, a maximum width of the first wire segment is D1 and a maximum width of the second wire segment is D2, wherein $D1<D2$.

2. The display panel of claim 1, wherein in the overlapping region and in the first direction, the width of the first wire segment is a fixed value and the width of the second wire segment is a fixed value.

3. The display panel of claim 2, wherein in the overlapping region and in the first direction, a shortest distance from a first edge of the first wire segment to an edge of the second wire segment is d1, and a shortest distance from a second edge of the first wire segment to an edge of the second wire segment is d2; and $d2 \geq d1 \geq 0$, and d2 and d1 are not zero at the same time.

4. The display panel of claim 1, wherein the second wire segment comprises a first sub-portion and a second sub-portion, the first sub-portion is located in the overlapping region, and the second sub-portion is located on one side of the first sub-portion facing away from the first wire segment; and in the first direction, a width of the first sub-portion is D21 and a width of the second sub-portion is D22, wherein D21≥D22.

5. The display panel of claim 4, wherein the second wire segment comprises a third sub-portion located between the first sub-portion and the second sub-portion, and a width of the third sub-portion varies in the first direction.

6. The display panel of claim 4, wherein D22=D1; or wherein the first wire segment comprises a fourth sub-portion and a fifth sub-portion, the fourth sub-portion is located in the overlapping region, and the fifth sub-portion is located on one side of the fourth sub-portion facing away from the second wire segment; and in the first direction, a width of the fourth sub-portion is D11 and a width of the fifth sub-portion is D12, wherein D11≠D12.

7. The display panel of claim 1, wherein a width of the overlapping region in the extension direction of the signal line is H, and H≥5 μm.

8. The display panel of claim 1, wherein the signal line comprises a first-type signal line and a second-type signal line;

a width of a first wire segment of the first-type signal line is greater than a width of a second wire segment of the first-type signal line in the first direction; and a width of a first wire segment of the second-type signal line is less than a width of a second wire segment of the second-type signal line in the first direction.

9. The display panel of claim 8, wherein at least one second-type signal line is comprised between two adjacent first-type signal lines in the first direction.

10. The display panel of claim 9, wherein the first-type signal line and the second-type signal line are alternately arranged in the first direction.

11. A display device, comprising the display panel of claim 1.

12. The display device of claim 11, wherein the display device is a spliced display device comprising at least two of the display panels;

the display panel comprises a first display panel and a second display panel, at least part of a signal line of the first display panel is disposed on one side of the first display panel facing towards the second display panel, and at least part of a signal line of the second display panel is disposed on one side of the second display panel facing towards the first display panel; and an orthographic projection of the signal line of the first display panel and an orthographic projection of the signal line of the second display panel are arranged at intervals in a direction perpendicular to a plane where a second wire segment is located.

13. The display device of claim 12, wherein a plurality of signal lines of the first display panel are provided, a plurality of signal lines of the second display panel are provided, and the plurality of signal lines of the first display panel and the plurality of signal lines of the second display panel are alternately arranged in the first direction.

14. The display device of claim 12, further comprising a driver chip disposed on one side of the substrate facing away from the array layer, wherein at least two driver chips are provided, a first connection pad of the first display panel is electrically connected to one of the at least two driver chips, and in a plane where the substrate is located, an orthographic projection of the one driver chip is located within an orthographic projection of the first display panel; and a first connection pad of the second display panel is electrically connected to another one of the at least two driver chips, and in the plane where the substrate is located, an orthographic projection of the another one driver chip is located within an orthographic projection of the second display panel.

15. A display panel, comprising:

an array substrate comprising a substrate and an array layer, wherein the array layer is disposed on one side of the substrate and comprises a pixel circuit;

a light-emitting element disposed on one side of the array layer facing away from the substrate;

a plurality of first connection pads disposed on the substrate and coupled to the pixel circuit; and a signal line comprising a first wire segment and a second wire segment, wherein the first wire segment is configured to connect a first connection pad of the plurality of first connection pads and the second wire segment, or the second wire segment is configured to connect a first connection pad of the plurality of first connection pads and the first wire segment;

wherein the display panel further comprises an overlapping region, in the overlapping region, the first wire segment and the second wire segment at least partially overlap in a direction perpendicular to a plane where the signal line is located; in the overlapping region, a width of the first wire segment is different from a width of the second wire segment in a first direction, and the first direction is perpendicular to an extension direction of the signal line; and wherein the array substrate comprises a first surface, a second surface and a third surface, wherein the first surface, the second surface and the third surface are connected to each other, the first surface is a surface on one side of the array layer facing away from the substrate, the third surface is a surface on one side of the substrate facing away from the array layer, and the second surface is located on one side of the array substrate perpendicular to a thickness direction of the display panel;

at least part of the first wire segment is disposed on the first surface or the third surface, and at least part of the second wire segment is disposed on the second surface; and at least part of the overlapping region is disposed on at least one of the first surface and the second surface.

16. The display panel of claim 15, wherein the second surface further comprises a first chamfer portion and a flat portion, and the first chamfer portion is configured to connect the first surface and the flat portion; and the overlapping region is disposed on at least one of the first chamfer portion and the first surface.

17. The display panel of claim 16, wherein the first chamfer portion is a circular arc surface with an arc radius less than or equal to 0.25 mm; or the first chamfer portion is an inclined surface, and a height and a width of the inclined surface are less than or equal to 0.25 mm.

18. A display panel, comprising:

an array substrate comprising a substrate and an array layer, wherein the array layer is disposed on one side of the substrate and comprises a pixel circuit;

a light-emitting element disposed on one side of the array layer facing away from the substrate;

a plurality of first connection pads disposed on the substrate and coupled to the pixel circuit; and a signal line comprising a first wire segment and a second wire segment, wherein the first wire segment is configured to connect a first connection pad of the plurality of first connection pads and the second wire segment, or the second wire segment is configured to connect a first connection pad of the plurality of first connection pads and the first wire segment;

wherein the display panel further comprises an overlapping region, in the overlapping region, the first wire segment and the second wire segment at least partially overlap in a direction perpendicular to a plane where the signal line is located; in the overlapping region, a width of the first wire segment is different from a width of the second wire segment in a first direction, and the first direction is perpendicular to an extension direction of the signal line; and wherein the first wire segment comprises a fourth sub-portion and a fifth sub-portion, wherein the fourth sub-portion and the fifth sub-portion are connected to each other, the fourth sub-portion is connected to the first connection pad, the fifth sub-portion is connected to the second wire segment, and in the first direction, a width of the fourth sub-portion is less than a width of the fifth sub-portion.

19. The display panel of claim 18, wherein a width of at least part of the fifth sub-portion gradually increases in a direction away from the fourth sub-portion; and in the first direction, the fifth sub-portion has one side edge which forms a portion of a concave curve.

* * * * *